US012610704B2

(12) United States Patent　　　(10) Patent No.:　US 12,610,704 B2
Jang　　　　　　　　　　　　　　　(45) Date of Patent:　　Apr. 21, 2026

(54) DISPLAY APPARATUS AND METHOD OF MANUFACTURING THE SAME

(71) Applicant: SAMSUNG DISPLAY CO., LTD., Yongin-si (KR)

(72) Inventor: Joonyung Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 346 days.

(21) Appl. No.: 18/198,389

(22) Filed: May 17, 2023

(65) Prior Publication Data

US 2023/0389379 A1　　Nov. 30, 2023

(30) Foreign Application Priority Data

May 31, 2022　(KR) ........................ 10-2022-0067230

(51) Int. Cl.
　*H10K 59/131*　　(2023.01)
　*G09G 3/3233*　　(2016.01)
　*H10K 59/12*　　(2023.01)
　*H10K 77/10*　　(2023.01)
　*H10K 102/00*　　(2023.01)

(52) U.S. Cl.
　CPC ......... *H10K 59/131* (2023.02); *G09G 3/3233* (2013.01); *H10K 59/1201* (2023.02); *H10K 77/111* (2023.02); *G09G 2300/0842* (2013.01); *H10K 2102/311* (2023.02)

(58) Field of Classification Search
　CPC ............. H10K 59/131; H10K 59/1201; H10K 77/111; H10K 2102/311; H10K 50/844; H10K 71/00; G09G 3/3233; G09G 2300/0842; G09G 2300/0426
　See application file for complete search history.

(56) References Cited

U.S. PATENT DOCUMENTS

| | | |
|---|---|---|
| 8,576,368 B2 | 11/2013 | Kim et al. |
| 9,601,557 B2 | 3/2017 | Yang et al. |
| 10,141,292 B2 | 11/2018 | Kim et al. |
| 10,546,203 B2 | 1/2020 | Lin et al. |
| 11,145,706 B2 | 10/2021 | Jang |
| 11,322,565 B2 | 5/2022 | Jeon et al. |
| 11,430,773 B2 | 8/2022 | Jung et al. |

(Continued)

FOREIGN PATENT DOCUMENTS

| | | |
|---|---|---|
| JP | 2005129757 A | 5/2005 |
| KR | 1020010080893 A | 8/2001 |

(Continued)

*Primary Examiner* — J.E. Schoenholtz

(74) *Attorney, Agent, or Firm* — CANTOR COLBURN LLP

(57) ABSTRACT

A display apparatus includes: a display panel including a first pad and a second pad; an electronic chip package including a first bump arranged to overlap the first pad and a second bump arranged to overlap the second pad; a first conductive adhesive layer arranged between the first pad and the first bump and including a first resin and a first conductive ball; a second conductive adhesive layer arranged between the second pad and the second bump and including a second resin including the same material as the first resin and a second conductive ball including the same material as the first conductive ball; and an elastic layer arranged between the first bump and the second bump and including an elastomer.

20 Claims, 20 Drawing Sheets

(56) References Cited

U.S. PATENT DOCUMENTS

| | | | |
|---|---|---|---|
| 11,545,461 B2 | 1/2023 | Kim et al. | |
| 2005/0142382 A1 | 6/2005 | Menda et al. | |
| 2013/0214794 A1* | 8/2013 | Lee .................. | G01R 31/2813 |
| | | | 324/537 |
| 2017/0335180 A1* | 11/2017 | Bae .................. | C09D 183/06 |
| 2019/0014664 A1* | 1/2019 | Ahn .................. | H05K 1/147 |
| 2020/0273942 A1* | 8/2020 | Lee .................. | H01L 23/544 |
| 2020/0403054 A1* | 12/2020 | Jang .................. | H01L 24/29 |
| 2022/0293832 A1* | 9/2022 | Min .................. | H10H 20/84 |

FOREIGN PATENT DOCUMENTS

| | | | |
|---|---|---|---|
| KR | 1020210080893 A | 8/2001 | |
| KR | 1020050065327 A | 6/2005 | |
| KR | 101309319 B1 | 9/2013 | |
| KR | 1020180041296 A | 4/2018 | |
| KR | 1020180131496 A | 12/2018 | |
| KR | 1020200081220 A | 7/2020 | |
| KR | 1020200145985 A | 12/2020 | |
| KR | 1020210053559 A | 5/2021 | |
| KR | 1020220001527 A | 1/2022 | |

* cited by examiner

FIG. 6

DISPLAY APPARATUS AND METHOD OF MANUFACTURING THE SAME

This application claims priority to Korean Patent Application No. 10-2022-0067230, filed on May 31, 2022, and all the benefits accruing therefrom under 35 U.S.C. § 119, the content of which in its entirety is herein incorporated by reference.

BACKGROUND

1. Field

Embodiments of the disclosure relate to a display apparatus, and more particularly, to a display apparatus, in which adhesion between a display panel and an electronic chip package is excellent and stretchability is improved at the same time.

2. Description of the Related Art

Research and development have been made on a flexible display apparatus that may be folded or rolled into a roll shape. Furthermore, research and development of a stretchable display apparatus that may be changed into various shapes is also being actively conducted. Such display apparatus may include a display panel which displays an image or the like and an electronic chip package which provides information about the image or the like. The display panel has, at its edge, pads electrically connected to display elements to receive an input of information about an image or the like.

SUMMARY

The pads may be electrically connected to bumps of the electronic chip package, and an anisotropic conductive film may be used to electrically connect the bumps of the electronic chip package and the pads of the display panel to each other. However, because an integral anisotropic conductive film is located on bumps in such display apparatus of the related art, the stretchability of the display apparatuses is reduced.

One or more embodiments include a display apparatus in which adhesion between a display panel and an electronic chip package is excellent and stretchability is improved. However, the embodiments are only examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes: a display panel including a first pad and a second pad; an electronic chip package including a first bump arranged to overlap the first pad and a second bump arranged to overlap the second pad; a first conductive adhesive layer arranged between the first pad and the first bump and including a first resin and a first conductive ball; a second conductive adhesive layer arranged between the second pad and the second bump and including a second resin including the same material as the first resin and a second conductive ball including the same material as the first conductive ball; and an elastic layer arranged between the first bump and the second bump and including an elastomer.

The second conductive adhesive layer may be arranged apart from the first conductive adhesive layer.

The elastic layer may further be arranged between the first conductive adhesive layer and the second conductive adhesive layer.

The elastic layer may further be arranged between the first pad and the second pad.

The display panel may further include a pad lower layer disposed under the first pad and the second pad and which includes a substrate, the electronic chip package may further include a body disposed on the first bump and the second bump, the elastic layer may be in contact with a portion of the pad lower layer, the portion being arranged between the first pad and the second pad in a plan view, and the elastic layer may be in contact with a portion of the body, the portion being arranged between the first bump and the second bump in the plan view.

The display apparatus may further include a third conductive adhesive layer disposed under the elastic layer and including a third resin including the same material as the first resin and a third conductive ball including the same material as the first conductive ball.

The third conductive adhesive layer may be arranged between the first conductive adhesive layer and the second conductive adhesive layer.

The third conductive adhesive layer may further be arranged between the first pad and the second pad.

The third conductive adhesive layer may be in contact with the first conductive adhesive layer and the second conductive adhesive layer.

The display panel may further include a pad lower layer disposed under the first pad and the second pad and which includes a substrate, the electronic chip package may further include a body disposed on the first bump and the second bump, the third conductive adhesive layer may be in contact with a portion of the pad lower layer, the portion being arranged between the first pad and the second pad in the plan view, and the elastic layer may be in contact with a portion of the body, the portion being arranged between the first bump and the second bump in the plan view.

The pad lower layer and the body may be stretchable, and when an external force greater than or equal to a certain magnitude is applied to the pad lower layer and the body, the third conductive adhesive layer may be apart from the first conductive adhesive layer and the second conductive adhesive layer.

When the external force greater than or equal to the certain magnitude is applied to the pad lower layer and the body, the elastic layer, the first conductive adhesive layer, the pad lower layer, and the third conductive adhesive layer may define an empty space in a cross-sectional view taken along a plane crossing the first pad, the second pad, the first bump, and the second bump and perpendicular to the substrate.

The elastic layer may include at least one of rubber, a urethane-based compound, and a silicon-based compound.

According to one or more embodiments, a method of manufacturing a display apparatus includes: providing a display panel including a first pad and a second pad; providing an electronic chip package including a first bump and a second bump; and bonding the display panel and the electronic chip package together, such that the first pad and the first bump overlap each other, the second pad and the second bump overlap each other, a first conductive adhesive layer including a first resin and a first conductive ball is arranged between the first pad and the first bump, a second conductive adhesive layer including a second resin including the same material as the first resin and a second conductive ball including the same material as the first conductive ball is arranged between the second pad and the second bump, and an elastic layer including an elastomer is arranged between the first bump and the second bump.

The bonding of the display panel and the electronic chip package together may include: arranging, on an anisotropic conductive film, the first bump and the second bump included in the electronic chip package and applying pressure to the electronic chip package; attaching the first conductive adhesive layer under the first bump by transferring a portion of the anisotropic conductive film to the first bump; attaching the second conductive adhesive layer under the second bump by transferring another portion of the anisotropic conductive film to the second bump; arranging the first bump on the first pad and arranging the second bump on the second pad; attaching the first conductive adhesive layer to the first pad; and attaching the second conductive adhesive layer to the second pad.

The display panel may further include a pad lower layer disposed under the first pad and the second pad and which includes a substrate, the electronic chip package may further include a body disposed on the first bump and the second bump, and the bonding of the display panel and the electronic chip package together may further include: arranging the elastic layer between the first bump and the second bump, by filling a space surrounded by the first pad, the first conductive adhesive layer, the first bump, the body, the second bump, the second conductive adhesive layer, the second pad, and the pad lower layer with an elastic layer composition, and heating the elastic layer composition.

The elastic layer may further be arranged between the first conductive adhesive layer and the second conductive adhesive layer.

The elastic layer may further be arranged between the first pad and the second pad.

The elastic layer may include at least one of rubber, a urethane-based compound, and a silicon-based compound.

The bonding of the display panel and the electronic chip package together may include: arranging the elastomer between the first bump and the second bump by arranging, on an elastomer layer including the elastomer, the first bump and the second bump included in the electronic chip package and applying pressure to the electronic chip package; arranging an anisotropic conductive film on the first pad and the second pad; arranging the first bump on the first pad; arranging the second bump on the second pad; and applying pressure to and heating the electronic chip package.

Other aspects, features, and advantages than those described above will become apparent from the following drawings, claims, and detailed descriptions to embody the disclosure below.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 6 is an enlarged schematic plan view of portions B and C of the display panel shown in FIG. 4;

DETAILED DESCRIPTION

Figure 1:
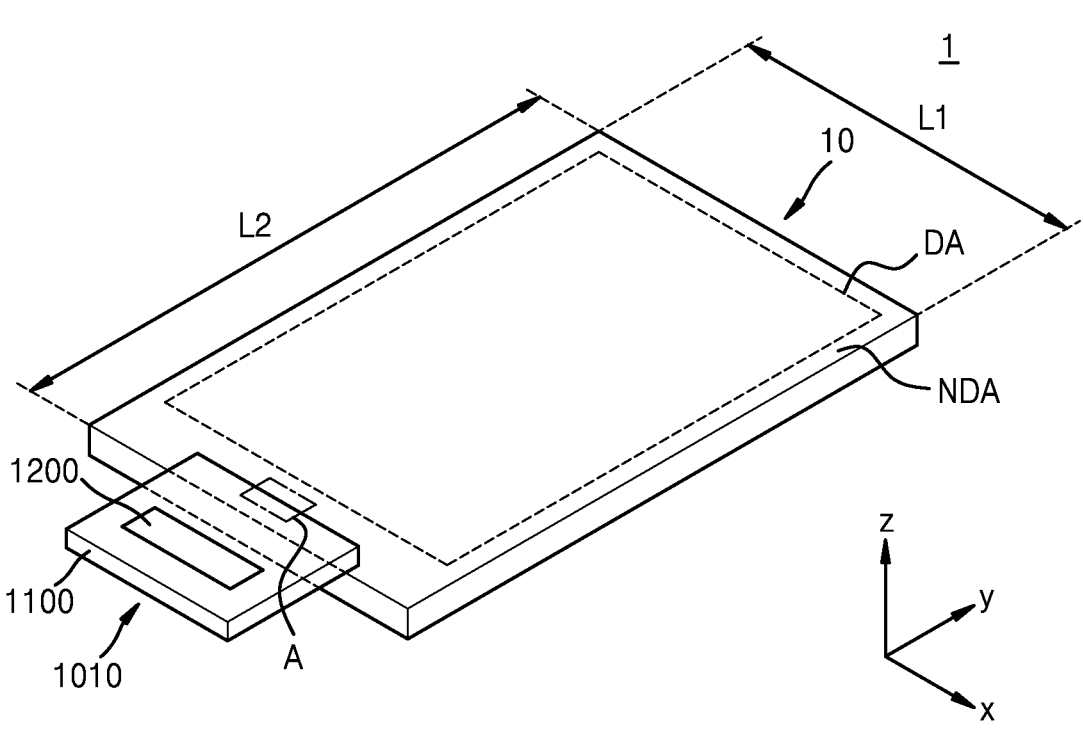
FIG. 1 is a schematic perspective view of a portion of a display apparatus according to an embodiment.

Reference will now be made in detail to embodiments, examples of which are illustrated in the accompanying drawings, wherein like reference numerals refer to like elements throughout the present specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, embodiments will be described, in detail, with reference to the accompanying drawings, and in the description with reference to the drawings, the same or corresponding components are indicated by the same reference numerals and redundant descriptions thereof are omitted.

In the following embodiment, it will be understood that when a component such as a layer, film, region, or plate is referred to as being "formed on" another layer, film, region, or plate, it can be directly or indirectly formed on the other layer, film, region, or plate. That is, for example, intervening layers, films, regions, or plates may be present. Sizes of components in the drawings may be exaggerated or reduced for convenience of explanation. In other words, since sizes and thicknesses of components in the drawings are arbitrarily illustrated for convenience of explanation, the following embodiments are not limited thereto.

In the following embodiment, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the following embodiment, it will be understood that although the terms "first," "second," etc. may be used herein to describe various components, these components should not be limited by these terms. These terms are only used to distinguish one component from another.

In the following embodiment, the expression of singularity in the present specification includes the expression of plurality unless clearly specified otherwise in context.

It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to" another layer, area, or component, it can be directly or indirectly connected to the other layer, region, or component. That is, for example, intervening layers, regions, or components may be present. For example, in the present specification, when a layer, region, or component is electrically connected to another layer, region, or component, the layers, regions, or components may not only be directly electrically connected, but may also be indirectly electrically connected via another layer, region, or component therebetween.

In the present specification, the expression "A and/or B" represents A, B, or A and B. In addition, the expression "at least one of A and B" represents A, B, or A and B.

A display apparatus displays an image and may be included in a portable electronic device, such as a game device, a multimedia device, and a miniature personal computer ("PC"). The display apparatus may include a liquid crystal display, an electrophoretic display, an organic light-emitting display, an inorganic electroluminescent ("EL") display (for example, inorganic light-emitting display), a field emission display, a surface-conduction electron-emitter display, a quantum dot display, a plasma display, a cathode ray display, and the like. Hereinafter, although an organic light-emitting display is described as a display apparatus according to an embodiment, various types of display apparatuses as described above may be used in embodiments.

Figure 2A:
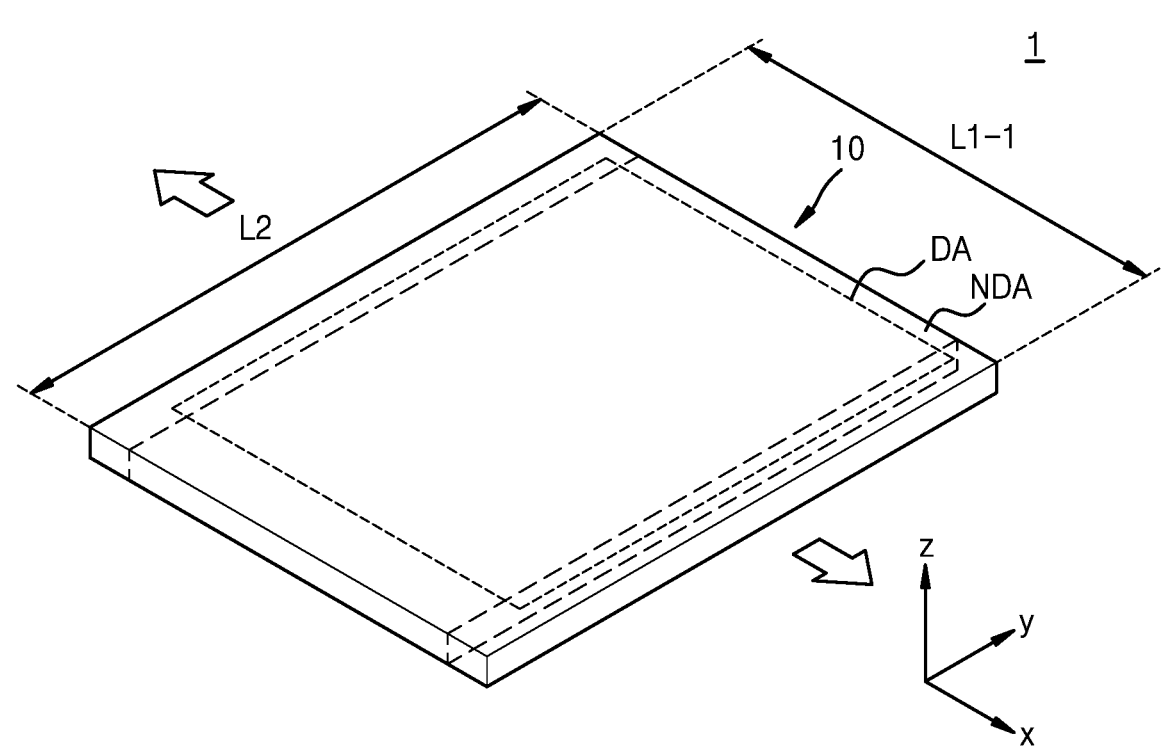
FIG. 2A is a perspective view of a first state in which a display panel included in the display apparatus of FIG. 1 stretches in a first direction.
Figure 2B:
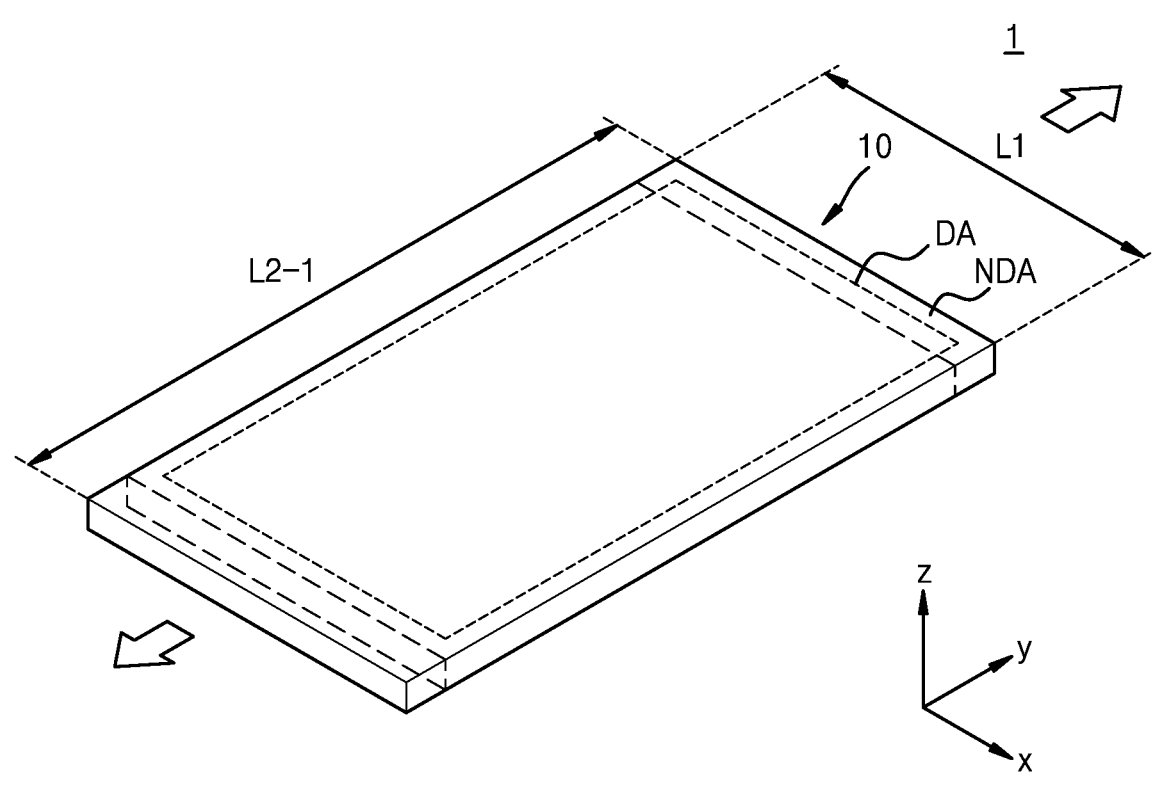
FIG. 2B is a perspective view of a second state in which the display panel included in the display apparatus of FIG. 1 stretches in a second direction.
Figure 3:
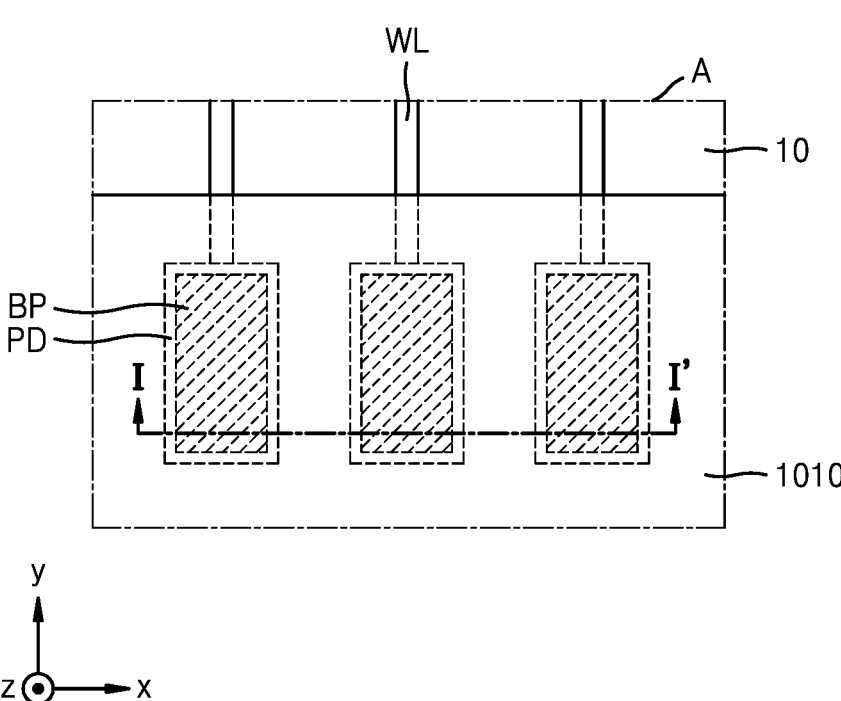
FIG. 3 is an enlarged schematic plan view of portion A of the display apparatus shown in FIG. 1.

FIG. 1 is a schematic perspective view of a portion of a display apparatus 1 according to an embodiment, FIG. 2A is a perspective view of a first state in which a display panel 10 included in the display apparatus 1 of FIG. 1 stretches in a first direction, and FIG. 2B is a perspective view of a second state in which the display panel 10 included in the display apparatus 1 of FIG. 1 stretches in a second direction. An electronic chip package 1010 is omitted in FIGS. 2A and 2B for convenience of explanation. FIG. 3 is an enlarged schematic plan view of portion A of the display apparatus 1 shown in FIG. 1. As used herein, the "plan view" means a view in z direction. In other words, the plan view is a view in a direction perpendicular to a major surface of the substrate.

As shown in FIG. 1, the display apparatus 1 may include the display panel 10 and the electronic chip package 1010. The display panel 10 displays an image or the like, and the electronic chip package 1010 may provide information about the image or the like to the display panel 10. The display panel 10 may include a display area DA and a non-display area NDA. The display area DA may include a plurality of pixels, and the display panel 10 may provide a certain image by using light emitted from the plurality of pixels. The non-display area NDA may be adjacent to the display area DA. In detail, the non-display area NDA may completely surround the display area DA. The display panel 10 includes a substrate 100 (see FIG. 7A), and thus, it may be understood that the substrate 100 includes the display area DA and the non-display area NDA.

The display panel 10 may include a first side L1 extending in the first direction and a second side L2 extending in the second direction. The first side L1 and the second side L2 may be edges of the display panel 10. The first direction and the second direction may cross each other. For example, the first direction and the second direction may form an acute angle. For example, the first direction and the second direction may form an obtuse angle or may be perpendicular to each other. Hereinafter, a case where the first direction is an x direction or a −x direction and the second direction is a y direction or a −y direction is mainly described in detail.

Referring to FIGS. 2A and 2B, the display panel 10 may be a stretchable display panel. Referring to FIG. 2A, when a tensile force is applied to the display panel 10 in the first direction (for example, the x direction or the −x direction), the display panel 10 may be stretched in the first direction (for example, the x direction or the −x direction). In this case, a first side L1-1 of FIG. 2A may be longer than the first side L1 of FIG. 1. Each of the display area DA and the non-display area NDA may be stretched in the first direction (for example, the x direction or the −x direction). In another embodiment, when a contractile force is applied to the display panel 10 in the first direction (for example, the x direction or the −x direction), the display panel 10 may be stretched in the first direction (for example, the x direction or the −x direction). In this case, the first side L1-1 of FIG. 2A may be smaller than the first side L1 of FIG. 1. Each of the display area DA and the non-display area NDA may be contracted in the first direction (for example, the x direction or the −x direction).

Referring to FIG. 2B, when a tensile force is applied to the display panel 10 in the second direction (for example, the y direction or the −y direction), the display panel 10 may be stretched in the second direction (for example, the y direction or the −y direction). In this case, a second side L2-1 of FIG. 2B may be longer than the second side L2 of FIG. 1. Each of the display area DA and the non-display area NDA may be stretched in the second direction (for example, the y direction or the −y direction). In another embodiment, when a contractile force is applied to the display panel 10 in the second direction (for example, the y direction or the −y direction), the display panel 10 may be contracted in the second direction (for example, the y direction or the −y direction). In this case, the second side L2-1 of FIG. 2B may be smaller than the second side L2 of FIG. 1. Each of the display area DA and the non-display area NDA may be contracted in the second direction (for example, the y direction or the −y direction). As such, when a tensile force or a contractile force is applied to the display panel 10, the display panel 10 may be transformed into various forms.

A driver configured to provide an electrical signal or power to pixels may be arranged in the non-display area NDA. As shown in FIG. 3, the non-display area NDA may include a plurality of pads PD, to which the electronic chip package 1010, a printed circuit board, or the like may be electrically connected. Each of the pads PD may be arranged apart from another, and the pads PD may be electrically connected to wires WL, respectively.

The electronic chip package 1010 may be disposed on the plurality of pads PD. The electronic chip package 1010 may have a chip on film ("COF") structure. In detail, the electronic chip package 1010 may include an electronic chip 1200 and a body 1100, on which the electronic chip 1200 is mounted. The electronic chip 1200 may include, for example, an integrated circuit ("IC") chip, and may be a data driving driver that generates a data signal to be applied to data lines in the display area DA. The body 1100 may be a flexible film. However, the disclosure is not limited thereto. For example, the electronic chip package 1010 may not include the body 1100. In other words, the electronic chip package 1010 may have a chip on panel (COP) structure. Hereinafter, for convenience of explanation, it is described that the electronic chip package 1010 includes the electronic chip 1200 and the body 1100, on which the electronic chip 1200 is mounted.

In detail, the electronic chip package 1010 may include bumps BP disposed under the body 1100, and the bumps BP of the electronic chip package 1010 may be disposed on the plurality of pads PD, respectively. The bumps BP may be electrically connected to the electronic chip 1200. The plurality of pads PD may be electrically connected to their corresponding bumps BP of the electronic chip package 1010, respectively, and accordingly, the display panel 10 may be electrically connected to the electronic chip package 1010 or the like. When the electronic chip package 1010 does not include the body 1100, the bumps BP may be disposed under the electronic chip 1200.

For convenience of explanation, FIG. 3 illustrates that areas of the pads PD are greater than areas of their corresponding bumps BP, respectively, but the disclosure is not limited thereto. For example, an area of the pad PD may be smaller than an area of the corresponding bump BP, and an area of the pad PD may be the same as an area of the corresponding bump BP. The plurality of pads PD are bonded to their corresponding bumps BP, respectively, by a conductive adhesive layer, and are electrically connected to their corresponding bumps BP, respectively. In other words, the conductive adhesive layer includes polymer resin and a conductive ball, and the conductive ball included in the conductive adhesive layer is in contact with the pads PD and the bumps BP corresponding to the pads PD, respectively, at the same time, thereby electrically connecting the pads PD and the bumps BP corresponding to the pads PD, respectively, to each other.

As described above with reference to FIGS. 2A and 2B, the non-display area NDA may be stretched or contracted when an external force is applied to the display panel 10. Accordingly, a distance between the pads PD may increase or decrease, and thus, a distance between the bumps BP electrically connected to the pads PD may also increase or decrease. In detail, the bumps BP are disposed under the body 1100 of the electronic chip package 1010, and thus, when an external force is applied to the display panel 10, a portion between the bumps BP of the body 1100 may increase or decrease. In other words, when viewed in a direction perpendicular to the body 1100 (for example, a z-axis direction), a portion between the bumps BP of the body 1100 may increase or decrease. Accordingly, even when the shape of the display panel 10 is transformed, the pads PD may be electrically connected to their corresponding bumps BP, respectively, in a stable manner.

However, as described below, a pad area PADA (see FIG. 4) including the plurality of pads PD may increase or decrease relatively small even when an external force is applied to the pad area PADA. Accordingly, the body 1100 of the electronic chip package 1010 may increase or decrease relatively small. Therefore, the pad area PADA of the display panel 10 and the body 1100 of the electronic chip package 1010 may not include an opening area, and the body 1100 may be stretchable by appropriately selecting a material included in the body 1100.

Figure 4:
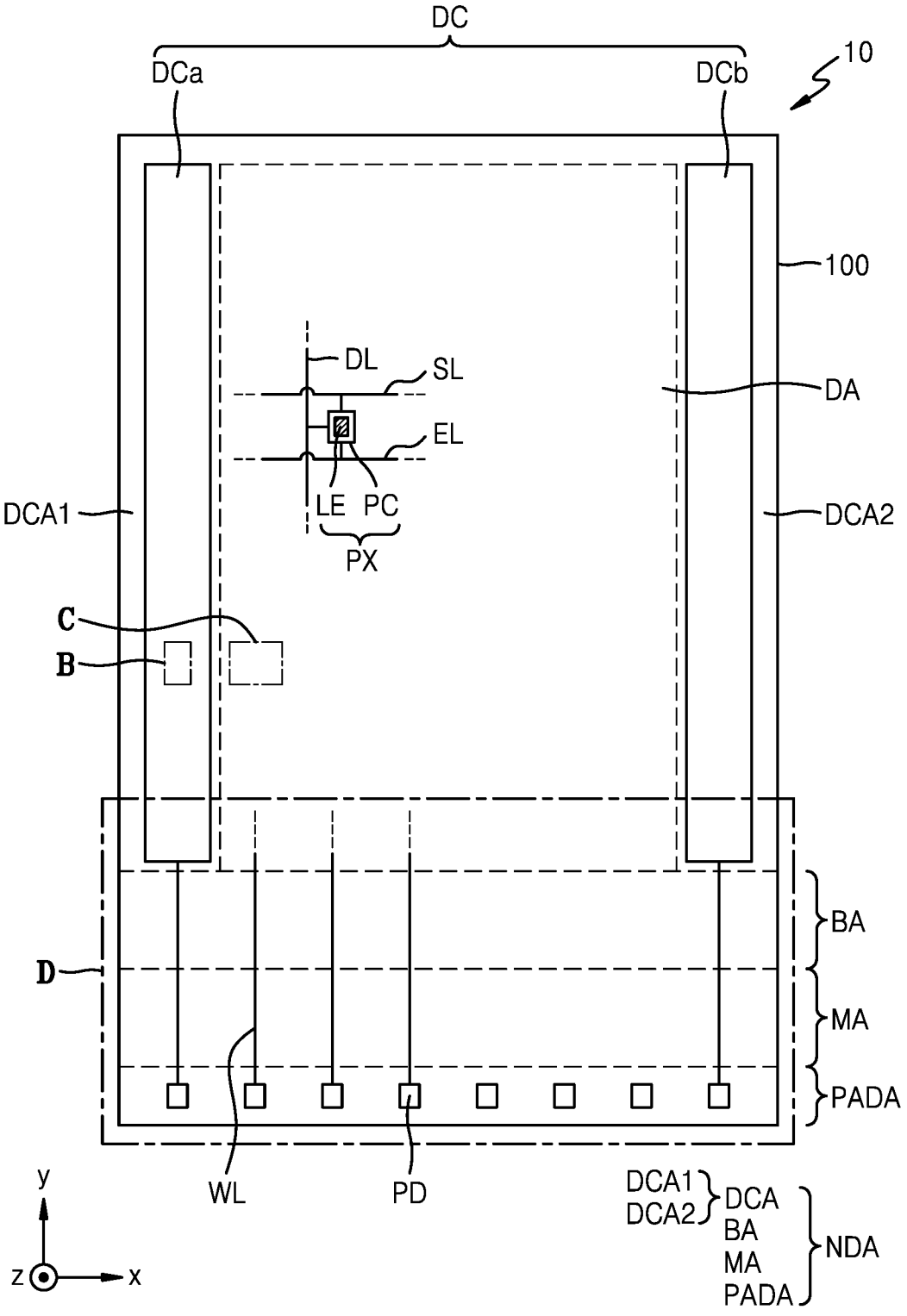
FIG. 4 is a schematic plan view of a portion of a display panel included in a display apparatus according to an embodiment.

FIG. 4 is a schematic plan view of a portion of the display panel 10 included in the display apparatus 1 according to an embodiment. As shown in FIG. 4, the display panel may include the display area DA and the non-display area NDA. The non-display area NDA may include a driving circuit area DCA, a buffer area BA, a middle area MA, and the pad area PADA. The display area DA may include at least a portion of a substrate 100, a pixel PX, a scan line SL, a data line DL, and an emission control line EL. The non-display area NDA may include at least a portion of the substrate 100, a driving circuit DC, at least a portion of a wire WL, and pads PD.

When an external force is applied to the display area DA, the display area DA may increase or decrease. For example, when an external force is applied to the display area DA in the first direction (for example, the x direction or the −x direction) and/or the second direction (for example, the y direction or the −y direction), the display area DA may be stretched or contracted in the first direction (for example, the x direction or the −x direction) and/or the second direction (for example, the y direction or the −y direction). A ratio of expansion and contraction of the display area DA in the second direction (for example, the y direction or the −y direction) may be a ratio of a length of the display area DA in the second direction (for example, the y direction or the −y direction) when an external force is applied, to a length of the display area DA in the second direction (for example, the y direction or the −y direction) when an external force is not applied.

The display area DA may include the pixel PX. In an embodiment, the pixel PX may include a plurality of pixels PX in the display area DA. The pixel PX may include a pixel circuit PC and a light-emitting element LE.

The pixel circuit PC may be configured to control the light-emitting element LE. The pixel circuit PC may include a plurality of pixel circuits PC in the display area DA. The pixel circuit PC may include at least one transistor and at least one storage capacitor. In an embodiment, the pixel circuit PC may be connected to the scan line SL and the data line DL. In an embodiment, the pixel circuit PC may be connected to the scan line SL, the emission control line EL, and the data line DL.

The light-emitting element LE may be connected to the pixel circuit PC. The light-emitting element LE may include a plurality of light-emitting elements LE in the display area DA. The light-emitting element LE may be an organic light-emitting diode including an organic emission layer. Alternatively, the light-emitting element LE may be a light-emitting diode ("LED") including an inorganic emission layer. The size of the LED may be micro scale or nano scale. For example, the LED may be a micro LED. Alternatively, the LED may be a nanorod LED. The nanorod LED may include gallium nitride (GaN). In an embodiment, a color conversion layer may be disposed on the nanorod LED. The color conversion layer may include quantum dots. Alternatively, the light-emitting element LE may be a quantum dot LED including a quantum dot emission layer. Hereinafter, a case where the light-emitting element LE is an organic LED is mainly described in detail.

The scan line SL may extend in the first direction (for example, the x direction or the −x direction). The scan line SL may be connected to the driving circuit DC. In an embodiment, the scan line SL may be connected to a scan driving circuit configured to generate a scan signal, in the driving circuit DC. The scan line SL may be connected to the pixel circuit PC. The scan line SL may be configured to receive a scan signal from the scan driving circuit and transmit the scan signal to the pixel circuit PC.

The data line DL may extend in the second direction (for example, the y direction or the −y direction). The data line DL may be connected to a data driving circuit (not shown). The data line DL may be connected to the pixel circuit PC. The data line DL may be configured to receive a data signal from the data driving circuit and transmit the data signal to the pixel circuit PC.

The emission control line EL may extend in the first direction (for example, the x direction or the −x direction). The emission control line EL may be connected to the driving circuit DC. In an embodiment, the emission control line EL may be connected to an emission control driving circuit configured to generate an emission control signal, in the driving circuit DC. The emission control line EL may be electrically connected to the pixel circuit PC. The emission control line EL may be configured to receive an emission control signal from the emission control driving circuit and transmit the emission control signal to the pixel circuit PC.

The non-display area NDA may be adjacent to the display area DA. In an embodiment, the non-display area NDA may at least partially surround the display area DA. For example, the non-display area NDA may completely surround the display area DA. The non-display area NDA may include the driving circuit area DCA, the buffer area BA, the middle area MA, and the pad area PADA.

The driving circuit area DCA may be adjacent to the display area DA in the first direction (for example, the x direction or the −x direction). The driving circuit area DCA may include the driving circuit DC. In an embodiment, the driving circuit area DCA may include a first driving circuit area DCA1 and a second driving circuit area DCA2. The display area DA may be arranged between the first driving circuit area DCA1 and the second driving circuit area DCA2. The driving circuit DC may include a left driving circuit DCa arranged in the first driving circuit area DCA1 and a right driving circuit DCb arranged in the second driving circuit area DCA2. The left driving circuit DCa may be arranged on the left side of the display area DA. The right driving circuit DCb may be arranged on the right side of the display area DA. In some embodiments, one of the left driving circuit DCa and the right driving circuit DCb may be omitted.

When an external force is applied to the driving circuit area DCA, the driving circuit area DCA may increase or decrease. For example, when an external force is applied to the driving circuit area DCA in the first direction (for example, the x direction or the −x direction) and/or the second direction (for example, the y direction or the −y direction), the driving circuit area DCA may be stretched or contracted in the first direction (for example, the x direction or the −x direction) and/or the second direction (for example, the y direction or the −y direction). A ratio of expansion and contraction of the driving circuit area DCA in the second direction (for example, the y direction or the −y direction) may be a ratio of a length of the driving circuit area DCA in the second direction (for example, the y direction or the −y direction) when an external force is applied, to a length of the driving circuit area DCA in the second direction (for example, the y direction or the −y direction) when an external force is not applied.

The buffer area BA may be adjacent to the display area DA and the driving circuit area DCA in the second direction (for example, the y direction or the −y direction). When an external force is applied to the buffer area BA, the buffer area BA may increase or decrease. For example, when an external force is applied to the buffer area BA in the first direction (for example, the x direction or the −x direction) and/or the second direction (for example, the y direction or the −y direction), the buffer area BA may be stretched or contracted in the first direction (for example, the x direction or the −x direction) and/or the second direction (for example, the y direction or the −y direction). A ratio of expansion and contraction of the buffer area BA in the second direction (for example, the y direction or the −y direction) may be a ratio of a length of the buffer area BA in the second direction (for example, the y direction or the −y direction) when an external force is applied, to a length of the buffer area BA in the second direction (for example, the y direction or the −y direction) when an external force is not applied.

The wire WL may be arranged in the buffer area BA. The wire WL may extend from the pad area PADA to the middle area MA and the buffer area BA. The wire WL may be a signal line configured to transmit an electrical signal to the driving circuit DC or the pixel PX, or a voltage line configured to transmit a power voltage to the driving circuit DC or the pixel PX.

A ratio of expansion and contraction of the display area DA may be greater than or equal to a ratio of expansion and contraction of the buffer area BA. In an embodiment, a ratio of expansion and contraction of the display area DA in the second direction (for example, the y direction or the −y direction) may be greater than or equal to a ratio of expansion and contraction of the buffer area BA in the second direction (for example, the y direction or the −y direction). In other words, when an external force is applied in the second direction (for example, the y direction or the −y direction), a degree of transformation of the display area DA in the second direction (for example, the y direction or the −y direction) may be greater than or equal to a degree of transformation of the buffer area BA in the second direction (for example, the y direction or the −y direction). In an embodiment, a ratio of expansion and contraction of the display area DA in the first direction (for example, the x direction or the −x direction) may be greater than or equal to a ratio of expansion and contraction of the buffer area BA in the first direction (for example, the x direction or the −x direction). In other words, when an external force is applied in the first direction (for example, the x direction or the −x direction), a degree of transformation of the display area DA in the first direction (for example, the x direction or the −x direction) may be greater than or equal to a degree of transformation of the buffer area BA in the first direction (for example, the x direction or the −x direction).

The middle area MA may be adjacent to the buffer area BA in the second direction (for example, the y direction or the −y direction). In other words, the buffer area BA may be arranged between the middle area MA and the display area DA. The wire WL may be arranged in the middle area MA. When an external force is applied to the middle area MA, the middle area MA may increase or decrease. For example, the middle area MA may be stretched or contracted in the first direction (for example, the x direction or the −x direction) and/or the second direction (for example, the y direction or the −y direction). A ratio of expansion and contraction of the middle area MA in the second direction (for example, the y direction or the −y direction) may be a ratio of a length of the middle area MA in the second direction (for example, the y direction or the −y direction) when an external force is applied, to a length of the middle area MA in the second direction (for example, the y direction or the −y direction) when an external force is not applied.

A ratio of expansion and contraction of the middle area MA may be greater than or equal to a ratio of expansion and contraction of the buffer area BA. In an embodiment, a ratio of expansion and contraction of the middle area MA in the second direction (for example, the y direction or the −y direction) may be greater than or equal to a ratio of expansion and contraction of the buffer area BA in the second direction (for example, the y direction or the −y direction). In other words, when an external force is applied in the second direction (for example, the y direction or the −y direction), a degree of transformation of the middle area MA in the second direction (for example, the y direction or the −y direction) may be greater than or equal to a degree of transformation of the buffer area BA in the second direction (for example, the y direction or the −y direction). In an embodiment, a ratio of expansion and contraction of the middle area MA in the first direction (for example, the x direction or the −x direction) may be greater than or equal to a ratio of expansion and contraction of the buffer area BA in the first direction (for example, the x direction or the −x direction). In other words, when an external force is applied in the first direction (for example, the x direction or the −x direction), a degree of transformation of the middle area MA in the first direction (for example, the x direction or the −x direction) may be greater than or equal to a degree of transformation of the buffer area BA in the first direction (for example, the x direction or the −x direction). In this case, the buffer area BA may function as a buffer. For example, the buffer area BA may reduce propagation of strain in a direction from the display area DA to the pad area PADA. In addition, the buffer area BA with a small degree of transformation may prevent or reduce damage to the display apparatus 1 occurring between the display area DA and the middle area MA. Accordingly, the wire WL arranged in the buffer area BA may be protected.

The pad area PADA may be arranged apart from the buffer area BA in the second direction (for example, the y direction or the −y direction). In detail, the middle area MA may be arranged between the pad area PADA and the buffer area BA. The pad area PADA may include the plurality of pads PD. The pads PD may be connected to the wires WL, respectively. The plurality of pads PD may be electrically connected to their corresponding bumps BP, respectively, and accordingly, the display panel 10 may be electrically connected to the electronic chip package 1010 or the like.

When an external force is applied to the pad area PADA, the pad area PADA may increase or decrease relatively small. For example, a ratio of expansion and contraction of the pad area PADA may be smaller than a ratio of expansion and contraction of the display area DA. Alternatively, a ratio of expansion and contraction of the pad area PADA may be smaller than a ratio of expansion and contraction of the buffer area BA. Alternatively, a ratio of expansion and contraction of the pad area PADA may be smaller than a ratio of expansion and contraction of the middle area MA. Accordingly, even when the shape of the display apparatus 1 is transformed in a state in which the pad PD of the display panel 10 and the bump BP of the electronic chip package 1010 are electrically connected to each other, the pad PD and the bump BP may be electrically connected to each other in a stable manner. Accordingly, a driving failure of the display apparatus 1 may be effectively prevented or reduced.

Figure 5:
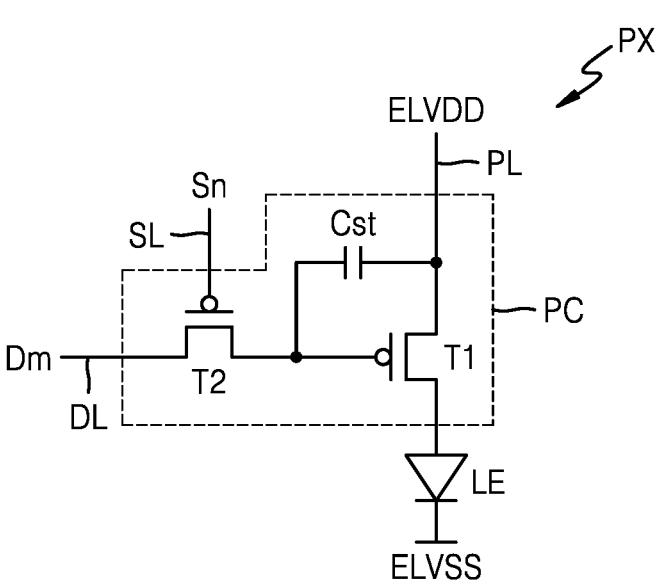
FIG. 5 is an equivalent circuit diagram of one pixel PX included in the display panel of FIG. 4.

FIG. 5 is an equivalent circuit diagram of one pixel PX included in the display panel 10 of FIG. 4. As shown in FIG. 5, the pixel PX may include the pixel circuit PC and the light-emitting element LE electrically connected to the pixel circuit PC. The pixel circuit PC may include a driving transistor T1, a switching transistor T2, and a storage capacitor Cst, as shown in FIG. 5.

The switching transistor T2 is connected to the scan line SL and the data line DL, and may be configured to transmit, to the driving transistor T1, a data signal Dm input from the data line DL according to a scan signal Sn input from the scan line SL.

The storage capacitor Cst is connected to the switching transistor T2 and a driving voltage line PL, and may store a voltage corresponding to a difference between a voltage received from the switching transistor T2 and a first power voltage ELVDD supplied to the driving voltage line PL.

The driving transistor T1 is connected to the driving voltage line PL and the storage capacitor Cst, and may be configured to control a driving current flowing from the driving voltage line PL to the light-emitting element LE according to a voltage value stored in the storage capacitor Cst. The light-emitting element LE may emit light having a certain luminance according to the driving current. An opposite electrode (for example, a cathode) of the light-emitting element LE may receive a second power voltage ELVSS.

Although FIG. 5 illustrates that the pixel circuit PC includes two transistors and one storage capacitor, the pixel circuit PC may include at least two transistors.

Figure 6:
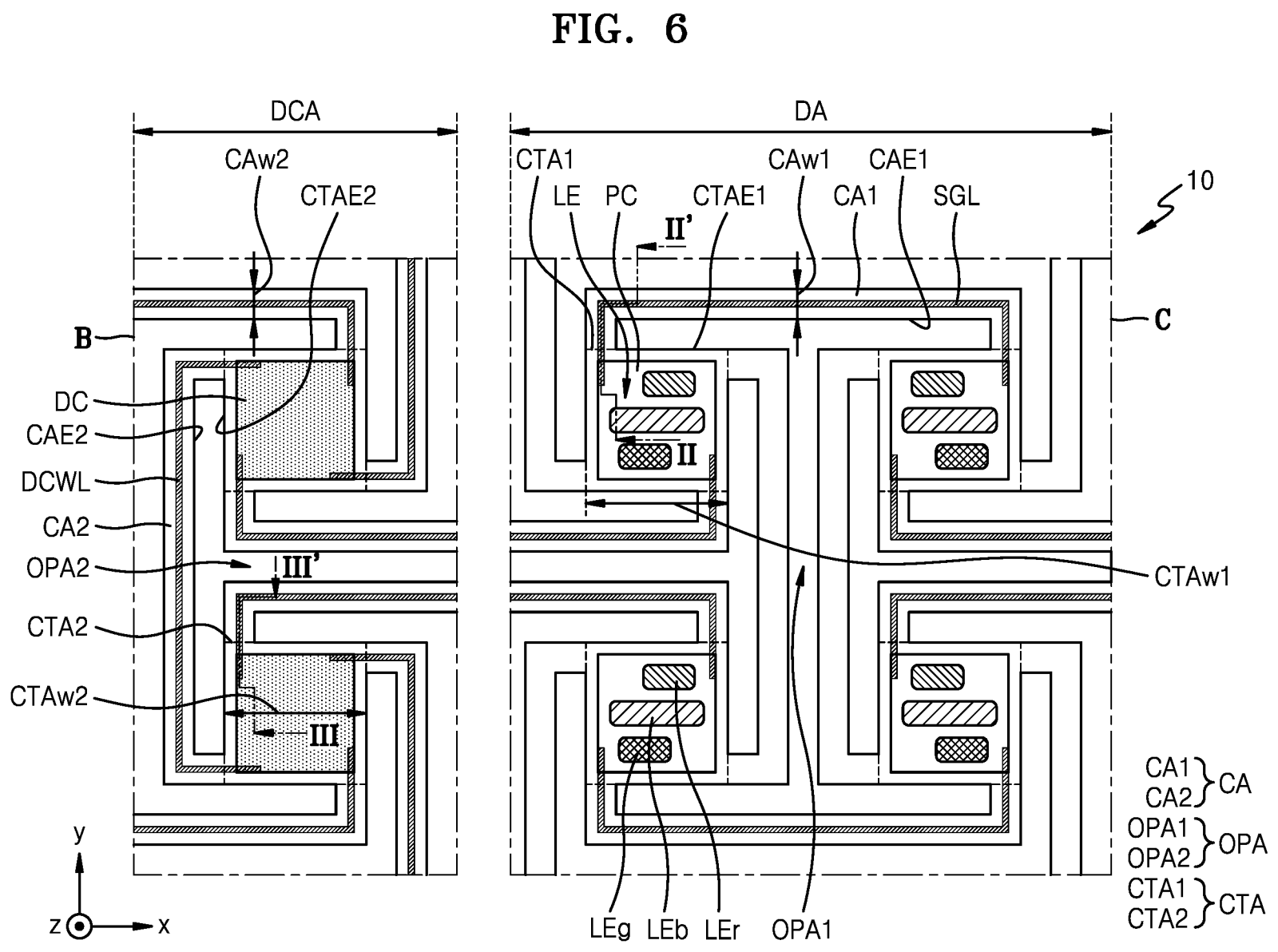

FIG. 6 is an enlarged schematic plan view of portions B and C of the display panel 10 shown in FIG. 4. As shown in FIG. 6, the display panel 10 may include the display area DA and the driving circuit area DCA. The display panel 10 may include a central area CTA, a connection area CA, and an opening area OPA. The central area CTA may be where a component of the display panel 10 is arranged. The central area CTA may include a plurality of central areas CTA. The plurality of central areas CTA may be apart from each other. The connection area CA may connect adjacent central areas CTA to each other. In the present specification, adjacent central areas CTA being connected to each other by the connection area CA may mean that the connection area CA extends between the adjacent central areas CTA, and the adjacent central areas CTA and the connection area CA are integrally provided. The connection area CA may include a plurality of connection areas CA. The opening area OPA may be where a component of the display panel 10 is not arranged. The opening area OPA may include a plurality of opening areas OPA. The plurality of opening areas OPA may be apart from each other. The plurality of central areas CTA, the plurality of connection areas CA, and the plurality of opening areas OPA may be included in the display area DA and/or the driving circuit area DCA.

The display area DA may include a first central area CTA1, a first connection area CA1, and a first opening area OPA1. The first central area CTA1 may include a plurality of first central areas CTA1. The plurality of first central areas CTA1 may be arranged in the first direction (for example, the x direction or the −x direction) and/or the second direction (for example, the y direction or the −y direction). In a plan view, a width CTAw1 of the first central area CTA1 may be a distance between edges of the first central area CTA1, the edges being opposite to each other in the first direction (for example, the x direction or the −x direction).

The first connection area CA1 may be a first bridge area. Adjacent first central areas CTA1 may be connected to each other by the first connection area CA1. For example, one first central area CTA1 may be connected to four first connection areas CA1. The four first connection areas CA1 may extend from respective vertices of the one first central area CTA1. The four first connection areas CA1 may respectively extend to first central areas CTA1 adjacent to the one first central area CTA1 connected to each of the four first connection areas CA1. Accordingly, the adjacent first central areas CTA1 may be connected to each other.

An extension direction of the first connection area CA1 may be changed. For example, the extension direction of the first connection area CA1 may be changed from the second direction (for example, the y direction or the −y direction) to the first direction (for example, the x direction or the −x direction). Alternatively, the extension direction of the first connection area CA1 may be changed from the first direction (for example, the x direction or the −x direction) to the second direction (for example, the y direction or the −y direction). FIG. 6 illustrates that an edge of the first connection area CA1 is bent at a right angle, but the disclosure is not limited thereto. For example, the edge of the first connection area CA1 may be bent at various angles, and the edge of the first connection area CA1 may be curved. A width CAw1 of the first connection area CA1 may be a distance between edges of the first connection area CA1, the edges being opposite to each other in the first direction (for example, the x direction or the −x direction).

The first opening area OPA1 may be arranged between adjacent first central areas CTA1. The first opening area OPA1 may be defined by edges CTAE1 of the first central areas CTA1 and edges CAE1 of the first connection area CA1.

FIG. 6 illustrates four first central areas CTA1 and first connection areas CA1 connected to the four first central areas CTA1, and the four first central areas CTA1 and the first connection areas CA1 connected to the four first central areas CTA1 may be defined as a basic unit. The basic unit may be repeated in the display area DA in the first direction (for example, the x direction or the −x direction) and/or the second direction (for example, the y direction or the −y direction).

The pixel circuit PC and the light-emitting element LE may be arranged in the first central area CTA1. The light-emitting element LE may be electrically connected to the pixel circuit PC. The light-emitting element LE may include a red light-emitting element LEr, a green light-emitting element LEg, and a blue light-emitting element LEb. The red light-emitting element LEr may emit red light, the green light-emitting element LEg may emit green light, and the blue light-emitting element LEb may emit blue light. However, the disclosure is not limited thereto. For example, the light-emitting element LE may include the red light-emitting element LEr, the green light-emitting element LEg, the blue light-emitting element LEb, and white light-emitting element.

A signal line SGL may be arranged in the first connection area CA1. The signal line SGL may be configured to transmit a signal to the pixel circuit PC. In detail, the signal line SGL may be configured to transmit, to the pixel circuit PC, a signal output from the driving circuit DC. Although not shown, a power wire configured to transmit a power voltage to the pixel circuit PC and a data line configured to transmit a data signal to the pixel circuit PC may be further arranged in the first connection area CA1.

The driving circuit area DCA may have the same or similar shape as the display area DA. In detail, the driving circuit area DCA may include a second central area CTA2, a second connection area CA2, and a second opening area OPA2. The shape of the second central area CTA2 of the driving circuit area DCA, the shape of the second connection area CA2, and the shape of the second opening area OPA2 may correspond to the shape of the first central area CTA1 of the display area DA, the shape of the first connection area CA1, and the shape of the first opening area OPA1, respectively. Thus, redundant descriptions thereof are omitted.

In detail, in a plan view, the shape of the first central area CTA1 may be the same as the shape of the second central area CTA2, and the shape of the first connection area CA1 may be the same as the shape of the second connection area CA2. In a plan view, the width CTAw1 of the first central area CTA1 may be the same as a width CTAw2 of the second central area CTA2, and a width CAw1 of the first connection area CA1 may be the same as a width CAw2 of the second connection area CA2. The shape of the first opening area OPA1 may be the same as the shape of the second opening area OPA2. The second opening area OPA2 may be arranged between adjacent second central areas CTA2.

Accordingly, the shape of the display panel 10 in the display area DA may be the same as the shape of the display panel 10 in the driving circuit area DCA. In this case, a phenomenon in which stress concentrates at a boundary between the display area DA and the driving circuit area DCA may be prevented or reduced.

The driving circuit DC may be arranged in the second central area CTA2. The driving circuit DC may generate and output a signal to be applied to the pixel circuit PC arranged in the same row. A driving circuit wire DCWL may be arranged in the second connection area CA2. The driving circuit wire DCWL may be electrically connected to the driving circuit DC. The driving circuit wire DCWL may be configured to transmit an external signal or a previous signal. However, the disclosure is not limited thereto. For example, the driving circuit wire DCWL may be a clock signal line configured to transmit a clock signal for driving the driving circuit DC, or a power wire configured to transmit a rated voltage for driving the driving circuit DC. The driving circuit wire DCWL may be the signal line SGL configured to transmit, to the pixel circuit PC, a signal output from the driving circuit DC, or a carry signal line configured to transmit, to the driving circuit DC, a carry signal output from the driving circuit DC.

Figure 7A:
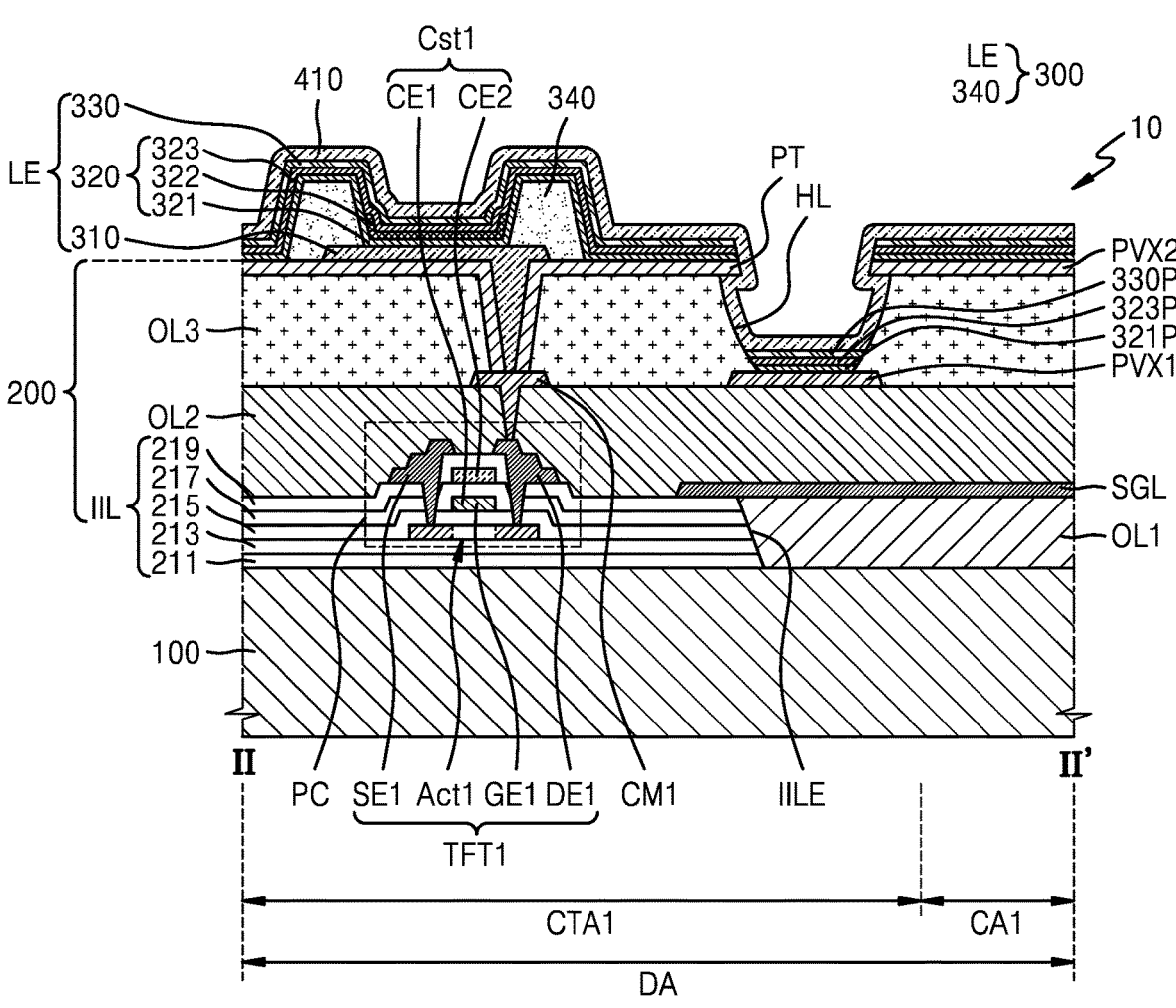
FIG. 7A is a schematic cross-sectional view of the display panel of FIG. 6 taken along line II-II' of FIG. 6.

FIG. 7A is a schematic cross-sectional view of the display panel 10 of FIG. 6 taken along line II-II' of FIG. 6.

As shown in FIG. 7A, the display panel 10 may include the display area DA. The display area DA may include the first central area CTA1 and the first connection area CA1. The display area DA may include the substrate 100, a circuit layer 200, a light-emitting element layer 300, and an inorganic encapsulation layer 410.

The substrate 100 may include polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. For example, the substrate 100 may include two layers including the polymer resin, and a barrier layer located between the two layers. In this case, the barrier layer may include an inorganic material such as a silicon nitride ($SiN_X$), a silicon oxide ($SiO_X$), and/or a silicon oxynitride ($SiO_XN_Y$). The substrate 100 including polymer resin may be flexible, rollable, and bendable. Alternatively, the substrate 100 may include glass or a metal.

The circuit layer 200 may be disposed on the substrate 100. The circuit layer 200 may include the pixel circuit PC, the signal line SGL, an inorganic insulating layer IIL, a first organic insulating layer OL1, a second organic insulating layer OL2, a first contact electrode CM1, a third organic insulating layer OL3, a first inorganic layer PVX1, and a second inorganic layer PVX2. The pixel circuit PC may include a first transistor TFT1 and a first storage capacitor Cst1. The first transistor TFT1 may include a first semiconductor layer Act1, a first gate electrode GE1, a first source electrode SE1, and a first drain electrode DE1. The first storage capacitor Cst1 may include a first capacitor electrode CE1 and a second capacitor electrode CE2.

The inorganic insulating layer IIL may be disposed on the substrate 100. The inorganic insulating layer IIL may include a barrier layer 211, a buffer layer 213, a first gate insulating layer 215, a second gate insulating layer 217, and an insulating interlayer 219.

The barrier layer 211 may be disposed on the substrate 100. The barrier layer 211 may prevent or reduce penetration of foreign materials. The barrier layer 211 may have a single-layered or multilayer structure including an inorganic material, such as $SiN_X$, $SiO_X$, and/or $SiO_XN_Y$.

The buffer layer 213 may be disposed on the barrier layer 211. The buffer layer 213 may include an inorganic insulating material, such as $SiN_X$, $SiO_XN_Y$, and $SiO_X$, and may have a single-layered or multilayer structure including the inorganic insulating material.

The first semiconductor layer Act1 may be disposed on the buffer layer 213. The first semiconductor layer Act1 may include polysilicon. Alternatively, the first semiconductor layer Act1 may include amorphous silicon, an oxide semiconductor, or an organic semiconductor. The first semiconductor layer Act1 may include a channel region, and a source region and a drain region at opposite sides of the channel region, respectively.

The first gate insulating layer 215 may be disposed on the first semiconductor layer Act1 and the buffer layer 213. The first gate insulating layer 215 may include an inorganic insulating material, such as $SiO_X$, $SiN_X$, $SiO_XN_Y$, an aluminum oxide ($Al_2O_3$), a titanium oxide ($TiO_2$), a tantalum oxide ($Ta_2O_5$), a hafnium oxide ($HfO_2$), or a zinc oxide ($ZnO_X$). $ZnO_X$ may include a zinc oxide (ZnO) and/or a zinc peroxide ($ZnO_2$).

The first gate electrode GE1 may be disposed on the first gate insulating layer 215. The first gate electrode GE1 may overlap the channel region of the first semiconductor layer Act1 in a plan view. The first gate electrode GE1 may include a low-resistance metal material. For example, the first gate electrode GE1 may include a conductive material including molybdenum (Mo), aluminum (Al), copper (Cu), or titanium (Ti), and may have a multilayer or single-layered structure including the conductive material.

The second gate insulating layer 217 may be disposed on the first gate electrode GE1 and the first gate insulating layer 215. The second gate insulating layer 217 may include an inorganic insulating material, such as $SiO_X$, $SiN_X$, $SiO_XN_Y$, $Al_2O_3$, $TiO_2$, $Ta_2O_5$, $HfO_2$, or $ZnO_X$.

The second capacitor electrode CE2 may be disposed on the second gate insulating layer 217. The second capacitor electrode CE2 may overlap the first gate electrode GE1 in a plan view. In this case, the first gate electrode GE1 may function as the first capacitor electrode CE1. FIG. 7A illustrates that the first storage capacitor Cst1 and the first transistor TFT1 overlap each other in a plan view, but the disclosure is not limited thereto. For example, the first storage capacitor Cst1 and the first transistor TFT1 may not overlap each other in a plan view. In this case, the first capacitor electrode CE1 and the first gate electrode GE1 may be separate electrodes. The second capacitor electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may have a single-layered or multilayer structure including the aforementioned material.

The insulating interlayer 219 may be disposed on the second capacitor electrode CE2 and the second gate insulating layer 217. The insulating interlayer 219 may include an inorganic insulating material, such as $SiO_X$, $SiN_X$, $SiO_XN_Y$, $Al_2O_3$, $TiO_2$, $Ta_2O_5$, $HfO_2$, or $ZnO_X$.

Each of the first source electrode SE1 and the first drain electrode DE1 may be disposed on the insulating interlayer 219. Each of the first source electrode SE1 and the first drain electrode DE1 may be connected to the first semiconductor layer Act1 through a contact hole provided in the first gate insulating layer 215, the second gate insulating layer 217, and the insulating interlayer 219. At least one of the first source electrode SE1 and the first drain electrode DE1 may include a conductive material including Mo, Al, Cu, or Ti, and may have a multilayer or single-layered structure including the conductive material. For example, at least one of the first source electrode SE1 and the first drain electrode DE1 may have a multilayer structure of Ti/Al/Ti.

The inorganic insulating layer IIL may overlap the first central area CTA1 and may not overlap the first connection area CA1 in the display area DA in a plan view. The inorganic insulating layer IIL may have an end portion IILE of the inorganic insulating layer IIL, the end portion IILE facing the first connection area CA1. Accordingly, the display panel 10 may be flexible in the first connection area CA1. FIG. 7A illustrates that the end portion IILE of the inorganic insulating layer IIL does not include a step, but the disclosure is not limited thereto. For example, the end portion IILE of the inorganic insulating layer IIL may include a step. The inorganic insulating layer IIL may overlap the first central area CTA1 and the first connection area CA1 in a plan view.

The first organic insulating layer OL1 may overlap the first connection area CA1. The first organic insulating layer OL1 may cover the end portion IILE of the inorganic insulating layer K. The first organic insulating layer OL1 may minimize a difference in heights when the signal line SGL extends from the first central area CTA1 to the first connection area CA1, and may absorb stress which may be applied to the signal line SGL. The first organic insulating layer OL1 may include an organic material. The first organic insulating layer OL1 may include an organic insulating material, such as a general-purpose polymer, such as polymethylmethacrylate ("PMMA") or polystyrene ("PS"), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The signal line SGL may be disposed on the inorganic insulating layer IIL and the first organic insulating layer OL1. The signal line SGL may extend from the first central area CTA1 to the first connection area CA1. Although not shown, the signal line SGL may be electrically connected to the pixel circuit PC. The signal line SGL may include a conductive material including Mo, Al, Cu, or Ti, and may have a multilayer or single-layered structure including the aforementioned material. For example, the signal line SGL may have a multilayer structure of Ti/Al/Ti.

The second organic insulating layer OL2 may be disposed on the inorganic insulating layer IIL, the first source electrode SE1, the first drain electrode DE1, and the signal line SGL. The second organic insulating layer OL2 may include an organic material. The second organic insulating layer OL2 may include an organic insulating material, such as a general purpose, polymer such as PMMA or PS, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The signal line SGL may be disposed between the first organic insulating layer OL1 and the second organic insulating layer OL2 in the first connection area CA1. When the shape of the display panel 10 is transformed, the first connection area CA1 may be bent. In this case, there may be a stress neutral plane in the display panel 10. The signal line SGL is arranged between the first organic insulating layer OL1 and the second organic insulating layer OL2, and thus, may be disposed on the stress neutral plane. Accordingly, stress applied to the signal line SGL may be minimized.

The first contact electrode CM1 may overlap the first central area CTA1 in a plan view, and may be disposed on the second organic insulating layer OL2. The first contact electrode CM1 may be electrically connected to the pixel circuit PC through a contact hole of the second organic insulating layer OL2. The first contact electrode CM1 may include a conductive material including Mo, Al, Cu, or Ti, and may have a multilayer or single-layered structure including the aforementioned material. The first contact electrode CM1 may have a multilayer structure of Ti/Al/Ti.

The third organic insulating layer OL3 may be disposed on the second organic insulating layer OL2 and the first contact electrode CM1. The third organic insulating layer OL3 may include an organic material. The third organic insulating layer OL3 may include an organic insulating material, such as a general-purpose polymer, such as PMMA or PS, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The first inorganic layer PVX1 may be arranged between the second organic insulating layer OL2 and the third organic insulating layer OL3. The first inorganic layer PVX1 may include an inorganic material.

The third organic insulating layer OL3 may include a hole HL. The hole HL may expose the first inorganic layer PVX1. The hole HL may be formed by etching the third organic insulating layer OL3, and the first inorganic layer PVX1 may prevent or reduce a component disposed under the first inorganic layer PVX1 from being over-etched.

The second inorganic layer PVX2 may be disposed on the third organic insulating layer OL3. The second inorganic layer PVX2 may have a protrusion tip PT protruding toward the center of the hole HL. A lower surface of the protrusion tip PT of the second inorganic layer PVX2 may be exposed through the hole HL.

The light-emitting element layer 300 may be disposed on the circuit layer 200. The light-emitting element layer 300 may include the light-emitting element LE and a pixel-defining layer 340. The light-emitting element LE may be an organic light-emitting diode. The light-emitting element LE may include a pixel electrode 310, an intermediate layer 320, and an opposite electrode 330.

The pixel electrode 310 may be electrically connected to the first contact electrode CM1 through a contact hole of the third organic insulating layer OL3. Accordingly, the light-emitting element LE may be electrically connected to the pixel circuit PC. The pixel electrode 310 may include a conductive oxide, such as an indium tin oxide ("ITO"), an indium zinc oxide ("IZO"), ZnO, an indium oxide ($In_2O_3$), an indium gallium oxide ("IGO"), or an aluminum zinc oxide ("AZO"). The pixel electrode 310 may include a reflective film including Ag, Mg, Al, Pt, Pd, Au, Ni, Nd, Ir, Cr, or a compound thereof. The pixel electrode 310 may further include a layer including ITO, IZO, ZnO, or $In_2O_3$ over and/or under the reflective film.

The pixel-defining layer 340 may cover an edge of the pixel electrode 310. The pixel-defining layer 340 may include a pixel opening, and the pixel opening may overlap the pixel electrode 310 in a plan view. The pixel opening may define an emission area in which light from the light-emitting element LE is emitted. The pixel-defining layer 340 may include an organic insulating material and/or an inorganic insulating material. In some embodiments, the pixel-defining layer 340 may include a light-blocking material.

The intermediate layer 320 may be disposed on the pixel electrode 310, the pixel-defining layer 340, and/or the second inorganic layer PVX2. The intermediate layer 320 may include an emission layer 322. The emission layer 322 may overlap the pixel electrode 310 in a plan view. The emission layer 322 may include a polymer or low molecular weight organic material, which emits light of a certain color.

The intermediate layer 320 may further include at least one of a first functional layer 321 and a second functional layer 323. The first functional layer 321 may be arranged between the pixel electrode 310 and the emission layer 322. The first functional layer 321 may include a hole transport layer ("HTL") and/or a hole injection layer ("HIL"). The second functional layer 323 may be arranged between the emission layer 322 and the opposite electrode 330. The second functional layer 323 may include an electron transport layer ("ETL") and/or an electron injection layer ("EIL"). The first functional layer 321 and the second functional layer 323 may completely overlap the first central area CTA1 and the first connection area CA1 in a plan view.

The opposite electrode 330 may be disposed on the pixel electrode 310, the intermediate layer 320, and the pixel-defining layer 340. The opposite electrode 330 may include a conductive material having a low work function. For example, the opposite electrode 330 may include a (semi) transparent layer including Ag, Mg, Al, Pt, Pd, Au, Ni, Nd, Ir, Cr, lithium (Li), Ca, or an alloy thereof. Alternatively, the opposite electrode 330 may further include a layer including ITO, IZO, ZnO, or $In_2O_3$ on the (semi)transparent layer including the aforementioned material.

The protrusion tip PT may be component for increasing the reliability of the display panel 10. At least one of the first functional layer 321 and the second functional layer 323 may include an organic material, external oxygen or moisture may be introduced into the light-emitting element LE through at least one of the first functional layer 321 and the second functional layer 323. The oxygen or moisture may damage the light-emitting element LE. In the present embodiment, because the second inorganic layer PVX2 has the protrusion tip PT protruding toward the center of the hole HL, each of the first functional layer 321 and the second functional layer 323 may be cut off with respect to the hole HL. Accordingly, the introduction of moisture or oxygen into the light-emitting element LE from the outside may be prevented or reduced. Accordingly, the reliability of the display panel 10 may increase.

At least one of a first functional layer pattern 321P including the same material as the first functional layer 321 and a second functional layer pattern 323P including the same material as the second functional layer 323 may be arranged in the hole HL. An opposite electrode pattern 330P including the same material as the opposite electrode 330 may be disposed on the first functional layer pattern 321P and/or the second functional layer pattern 323P.

The inorganic encapsulation layer 410 may be disposed on the light-emitting element layer 300. The inorganic encapsulation layer 410 may continuously and completely overlap the first central area CTA1 and the first connection area CA1 in a plan view. The inorganic encapsulation layer 410 may be in direct contact with the lower surface of the protrusion tip PT of the second inorganic layer PVX2. Accordingly, the introduction of moisture or oxygen into the light-emitting element LE from the outside may be prevented or reduced.

Although not shown, an organic encapsulation layer may be disposed on the inorganic encapsulation layer 410 to overlap the light-emitting element LE in a plan view, and an additional inorganic encapsulation layer may be further disposed on the organic encapsulation layer. Although not shown, a touch sensor layer and an optical functional layer may be further disposed on the inorganic encapsulation layer 410. In detail, the touch sensor layer may be disposed on the inorganic encapsulation layer 410, and the optical functional layer may be disposed on the touch sensor layer.

The touch sensor layer may sense coordinate information according to an external input, for example, a touch event. The touch sensor layer may include a sensor electrode and touch wires connected to the sensor electrode. The touch sensor layer may detect an external input by using a self-capacitance method or a mutual capacitance method. The optical functional layer may reduce reflectance of light (for example, external light) incident on the display panel 10. The optical functional layer may improve color purity of light emitted from the display panel 10. The optical functional layer may include a retarder and a polarizer, or may include a black matrix and color filters.

Figure 7B:
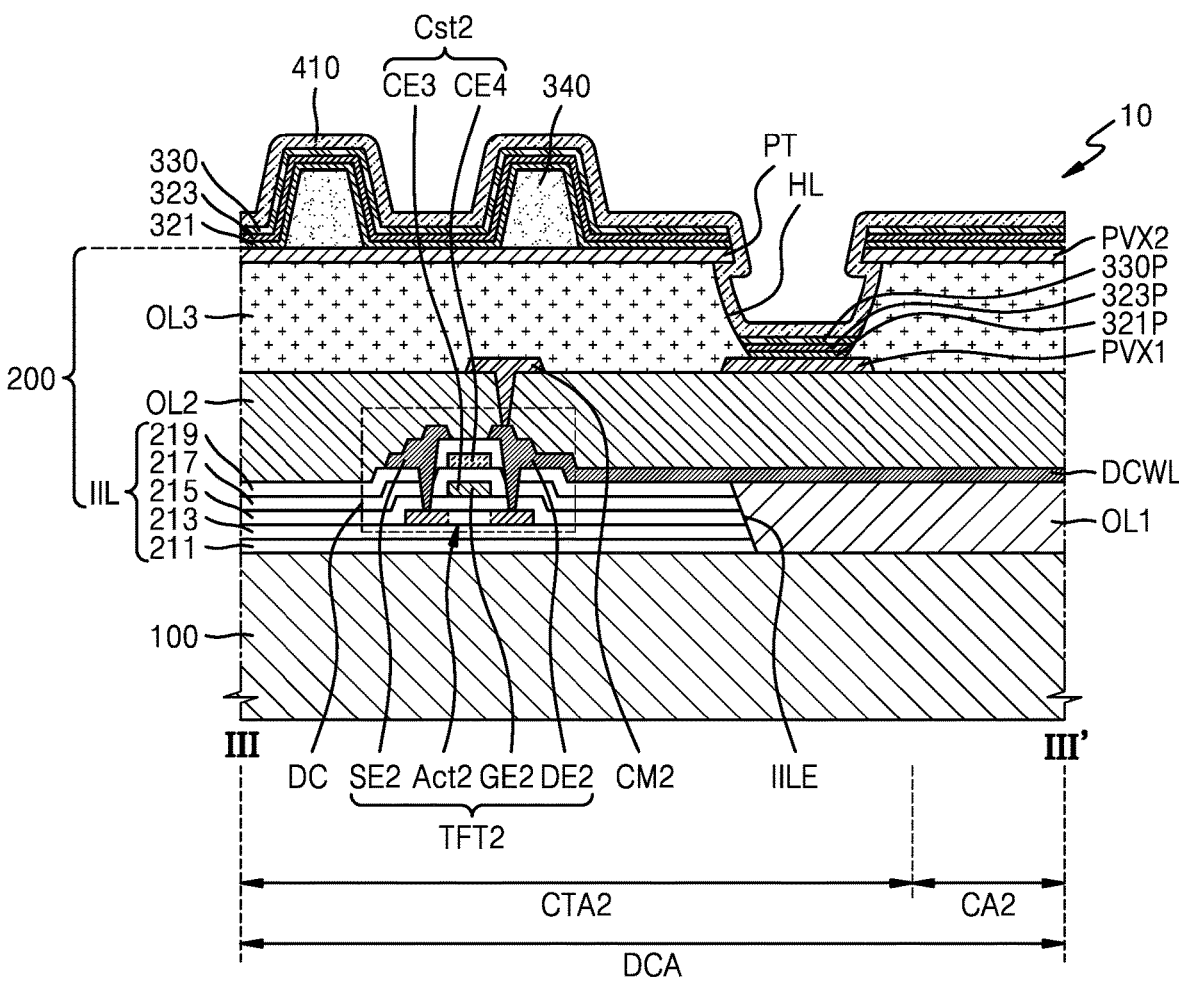
FIG. 7B is a schematic cross-sectional view of the display panel of FIG. 6 taken along line III-III' of FIG. 6.

FIG. 7B is a schematic cross-sectional view of the display panel 10 of FIG. 6 taken along line III-III' of FIG. 6. The same reference numerals in FIGS. 7A and 7B denote the same members, and thus, redundant descriptions thereof are omitted.

As shown in FIG. 7B, the display panel 10 may include the driving circuit area DCA. The driving circuit area DCA may include the second central area CTA2 and the second connection area CA2. The driving circuit area DCA may include the substrate 100, the circuit layer 200, the light-emitting element layer 300, and the inorganic encapsulation layer 410.

The circuit layer 200 may be disposed on the substrate 100. The circuit layer 200 may include the driving circuit DC, the driving circuit wire DCWL, the first organic insulating layer OL1, the second organic insulating layer OL2, a second contact electrode CM2, the third organic insulating layer OL3, the first inorganic layer PVX1, and the second inorganic layer PVX2. The driving circuit DC may include a second transistor TFT2 and a second storage capacitor Cst2. The second transistor TFT2 may include a second semiconductor layer Act2, a second gate electrode GE2, a second source electrode SE2, and a second drain electrode DE2. The second storage capacitor Cst2 may include a third capacitor electrode CE3 and a fourth capacitor electrode CE4.

The inorganic insulating layer IIL may be disposed on the substrate 100. The inorganic insulating layer IIL may include the barrier layer 211, the buffer layer 213, the first gate insulating layer 215, the second gate insulating layer 217, and the insulating interlayer 219.

The second semiconductor layer Act2 may be arranged between the buffer layer 213 and the first gate insulating layer 215. The second semiconductor layer Act2 may include polysilicon. Alternatively, the second semiconductor layer Act2 may include amorphous silicon, an oxide semiconductor, or an organic semiconductor. The second semiconductor layer Act2 may include a channel region, and a source region and a drain region at opposite sides of the channel region, respectively.

The second gate electrode GE2 may be arranged between the first gate insulating layer 215 and the second gate insulating layer 217. The second gate electrode GE2 may overlap the channel region of the second semiconductor layer Act2 in a plan view. The second gate electrode GE2 may include a low-resistance metal material. For example, the second gate electrode GE2 may include a conductive material including Mo, Al, Cu, or Ti, and may have a multilayer or single-layered structure including the conductive material.

The fourth capacitor electrode CE4 may be arranged between the second gate insulating layer 217 and the insulating interlayer 219. The fourth capacitor electrode CE4 may overlap the second gate electrode GE2. In this case, the second gate electrode GE2 may function as the third capacitor electrode CE3. FIG. 7B illustrates that the second storage capacitor Cst2 and the second transistor TFT2 overlap each other, but the disclosure is not limited thereto. For example, the second storage capacitor Cst2 and the second transistor TFT2 may not overlap each other in a plan view. In this case, the third capacitor electrode CE3 and the second gate electrode GE2 may be separate electrodes. The fourth capacitor electrode CE4 may include Al, Pt, Pd, Ag, Mg, Au, Ni, Nd, Ir, Cr, Ca, Mo, Ti, W, and/or Cu, and may have a single-layered or multilayer structure including the aforementioned material.

Each of the second source electrode SE2 and the second drain electrode DE2 may be disposed on the insulating interlayer 219. Each of the second source electrode SE2 and the second drain electrode DE2 may be connected to the second semiconductor layer Act2 through a contact hole provided in the first gate insulating layer 215, the second gate insulating layer 217, the insulating interlayer 219. At least one of the second source electrode SE2 and the second drain electrode DE2 may include a conductive material including Mo, Al, Cu, or Ti, and may have a multilayer or single-layered structure including the conductive material. For example, at least one of the second source electrode SE2 and the second drain electrode DE2 may have a multilayer structure of Ti/Al/Ti.

The inorganic insulating layer IIL may overlap the second central area CTA2 and may not overlap the second connection area CA2 in the driving circuit area DCA in a plan view. The inorganic insulating layer IIL may have the end portion IILE of the inorganic insulating layer IIL, the end portion IILE facing the second connection area CA2. Accordingly, the display panel 10 may be flexible in the second connection area CA2. The first organic insulating layer OL1 may overlap the second connection area CA2 in a plan view. The first organic insulating layer OL1 may cover the end portion IILE of the inorganic insulating layer K. The first organic insulating layer OL1 may minimize a difference in heights when the driving circuit wire DCWL extends from the second central area CTA2 to the second connection area CA2 or may also absorb stress which may be applied to the wire WL.

The driving circuit wire DCWL may be disposed on the inorganic insulating layer IIL and the first organic insulating layer OL1. The driving circuit wire DCWL may extend from the second central area CTA2 to the second connection area CA2. The driving circuit wire DCWL may be electrically connected to the driving circuit DC. In an embodiment, the driving circuit wire DCWL may be provided integrally with the second source electrode SE2 or the second drain electrode DE2. In an embodiment, the driving circuit wire DCWL may be connected to the second gate electrode GE2. The driving circuit wire DCWL is located between the first organic insulating layer OL1 and the second organic insulating layer OL2 in the second connection area CA2, and thus, may be disposed on the stress neutral plane. Accordingly, stress applied to the driving circuit wire DCWL may be minimized.

The second contact electrode CM2 may overlap the second central area CTA2 in a plan view, and may be arranged between the second organic insulating layer OL2 and the third organic insulating layer OL3. The second contact electrode CM2 may be connected to the driving circuit DC through a contact hole of the second organic insulating layer OL2. The second contact electrode CM2 may include a conductive material including Mo, Al, Cu, or Ti, and may have a multilayer or single-layered structure including the conductive material. For example, the second contact electrode CM2 may have a multilayer structure of Ti/Al/Ti.

The emission layer 322 may not be arranged in the non-display area NDA. In other words, the emission layer 322 may not be arranged in the driving circuit area DCA included in the non-display area NDA. Accordingly, the second functional layer 323 may be disposed on the first functional layer 321 in the driving circuit area DCA.

Figure 8:
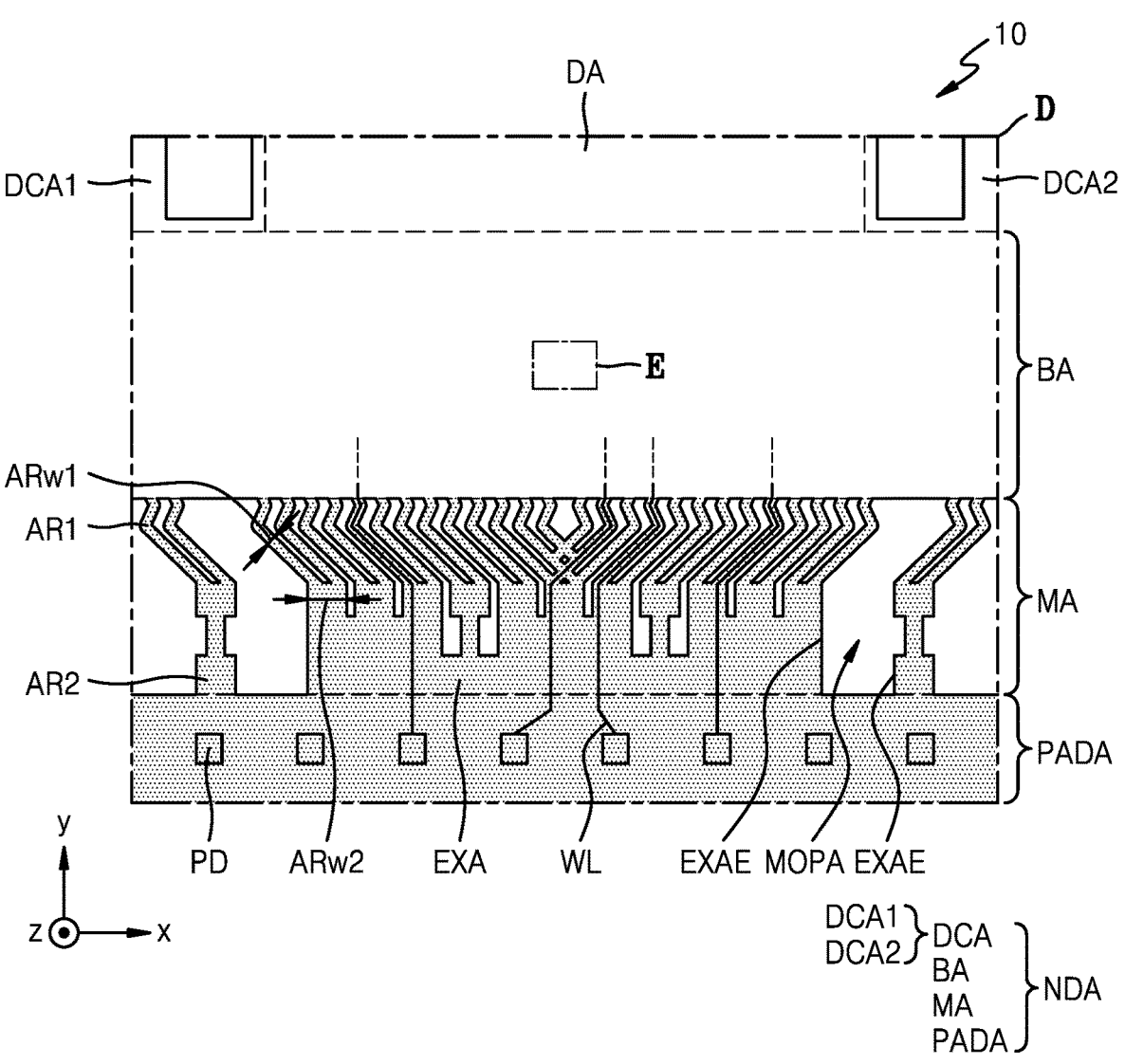
FIG. 8 is an enlarged schematic plan view of portion D of the display panel shown in FIG. 4.

FIG. 8 is an enlarged schematic plan view of portion D of the display panel 10 shown in FIG. 4. The same reference numerals in FIGS. 4 and 8 denote the same members, and thus, redundant descriptions thereof are omitted.

As shown in FIG. 8, the buffer area BA may be adjacent to the display area DA and the driving circuit area DCA in the second direction (for example, the y direction or the −y direction). The wire WL may be arranged in the buffer area BA. The wire WL may extend from the pad area PADA to the middle area MA and the buffer area BA.

When an external force is applied to the buffer area BA, the buffer area BA may increase or decrease. For example, when an external force is applied to the buffer area BA in the first direction (for example, the x direction or the −x direction) and/or the second direction (for example, the y direction or the −y direction), the buffer area BA may be stretched or contracted in the first direction (for example, the x direction or the −x direction) and/or the second direction (for example, the y direction or the −y direction). A ratio of expansion and contraction of the buffer area BA in the second direction (for example, the y direction or the −y direction) may be a ratio of a length of the buffer area BA in the second direction (for example, the y direction or the −y direction) when an external force is applied, to a length of the buffer area BA in the second direction (for example, the y direction or the −y direction) when an external force is not applied.

Figure 9:
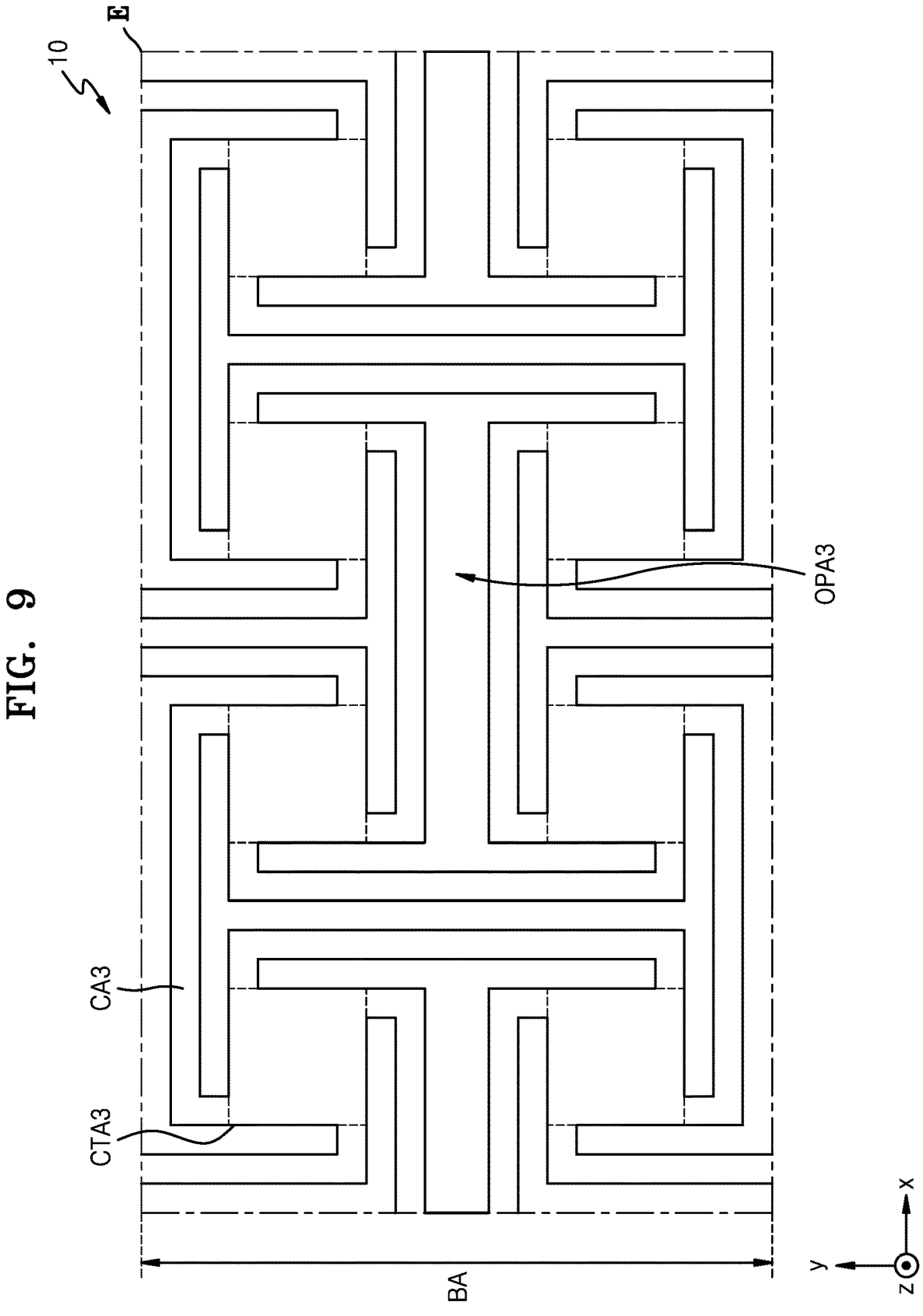
FIG. 9 is an enlarged schematic plan view of portion E of the display panel shown in FIG. 8.

As shown in FIG. 9 which is an enlarged schematic plan view of portion E of the display panel 10 shown in FIG. 8, the buffer area BA may have the same or similar shape as the display area DA. In detail, the buffer area BA may include a third central area CTA3, a third connection area CA3, and a third opening area OPA3. The shape of the third central area CTA3 of the buffer area BA, the shape of the third connection area CA3, and the shape of the third opening area OPA3 may correspond to the shape of the first central area CTA1 of the display area DA, the shape of the first connection area CA1, and the shape of the first opening area OPA1, respectively. Thus, redundant descriptions thereof are omitted.

In detail, in a plan view, the shape of the first central area CTA1 may be the same as the shape of the third central area CTA3, and the shape of the first connection area CA1 may be the same as the shape of the second connection area CA2. However, a width of the third central area CTA3 and a width of the third connection area CA3 may be appropriately selected so that the buffer area BA may be stretched or contracted by a preset length when an external force is applied to the buffer area BA. The shape of the first opening area OPA1 may be the same as the shape of the third opening area OPA3. The third opening area OPA3 may be arranged between adjacent third central areas CTA3.

Although not shown, the wire WL may be arranged in the third central area CTA3 and the third connection area CA3. The wire WL may extend from the pad area PADA and may pass through the middle area MA and the buffer area BA. The wire WL passing through the middle area MA and the buffer area BA may extend to the display area DA or the driving circuit area DCA.

A ratio of expansion and contraction of the buffer area BA in the second direction (for example, the y direction or the −y direction) may be smaller than or equal to a ratio of expansion and contraction of the display area DA in the second direction (for example, the y direction or the −y direction), and a ratio of expansion and contraction of the buffer area BA in the second direction (for example, the y direction or the −y direction) may be smaller than or equal to a ratio of expansion and contraction of the middle area MA in the second direction (for example, the y direction or the −y direction). Accordingly, the buffer area BA with a small degree of transformation may prevent or reduce damage to the display apparatus 1 occurring between the display area DA and the middle area MA. Also, the wire WL which may be arranged in the buffer area BA may be protected.

The middle area MA may be adjacent to the buffer area BA in the second direction (for example, the y direction or the −y direction). In other words, the buffer area BA may be arranged between the middle area MA and the display area DA. The wire WL may be arranged in the middle area MA. When an external force is applied to the middle area MA, the middle area MA may increase or decrease. For example, the middle area MA may be stretched or contracted in the first direction (for example, the x direction or the −x direction) and/or the second direction (for example, the y direction or the −y direction).

The middle area MA may include a plurality of extension areas EXA and a middle opening area MOPA. The plurality of extension areas EXA may extend from the pad area PADA to the buffer area BA. The middle opening area MOPA may be arranged between adjacent extension areas EXA. The middle opening area MOPA may be defined by edges EXAE of adjacent extension areas EXA and an edge of the buffer area BA. The middle opening area MOPA may be where a component of the display apparatus 1 is not arranged in the middle area MA. In this case, when an external force is applied to the middle area MA, the middle area MA may increase or decrease, and even when an external force is applied to the display apparatus 1, stress may not be concentrated. Accordingly, the non-display area NDA may be transformed into various forms without damage.

The wire WL may be arranged in each of the plurality of extension areas EXA. For example, one wire WL may be arranged in one extension area EXA. However, the disclosure is not limited thereto. For example, a plurality of wires WL may be arranged in one extension area EXA. In this case, the plurality of wires WL may be arranged apart from each other in one extension area EXA. For example, the plurality of wires WL may be arranged apart from each other by about 100 nm or more in one extension area EXA.

The shape of the plurality of extension areas EXA may be symmetrical in the second direction (for example, the y direction or the −y direction). The extension area EXA may include a first area AR1 and a second area AR2. The first area AR1 may be adjacent to the buffer area BA. The first area AR1 may extend in a direction inclined with respect to the second direction (for example, the y direction or the −y direction) in a plan view. The second area AR2 may be adjacent to the pad area PADA. The second area AR2 may extend in the second direction (for example, the y direction or the −y direction). A plurality of first areas AR1 may be connected to one second area AR2. In a plan view, a width ARw1 of the first area AR1 in a direction perpendicular to a direction in which the extension area EXA extends may be smaller than a width ARw2 of the second area AR2 in a direction perpendicular to a direction in which the extension area EXA extends. In this case, an elongation ratio of the middle area MA may decrease toward the pad area PADA. Accordingly, even when the shape of the display panel 10 is transformed, damage to the pad area PADA due to transformation of the pad area PADA may be prevented or reduced.

The pad area PADA may be adjacent to the middle area MA in the second direction (for example, the y direction or the −y direction). In other words, the middle area MA may be arranged between the pad area PADA and the buffer area BA. The pad area PADA may include the plurality of pads PD. The pads PD may be connected to the wires WL, respectively.

The pad area PADA may not include an opening area. However, as described above, the pad area PADA may increase or decrease when an external force is applied to the pad area PADA. However, when an external force is applied to the pad area PADA, a degree to which the pad area PADA increases or decreases may be less than the display area DA, the buffer area BA, or the middle area MA. In other words, a ratio of expansion and contraction of the pad area PADA may be smaller than a ratio of expansion and contraction of the display area DA, the buffer area BA, or the middle area MA, which may be achieved by appropriately selecting a material included in the pad area PADA. In other words, by appropriately selecting the material included in the pad area PADA, the pad area PADA may be stretchable even when the pad area PADA does not include an opening area. However, the disclosure is not limited thereto. For example, the pad area PADA may include an opening area. Even in this case, a ratio of expansion and contraction of the pad area PADA may be smaller than a ratio of expansion and contraction of the display area DA, the buffer area BA, or the middle area MA.

Figure 10:
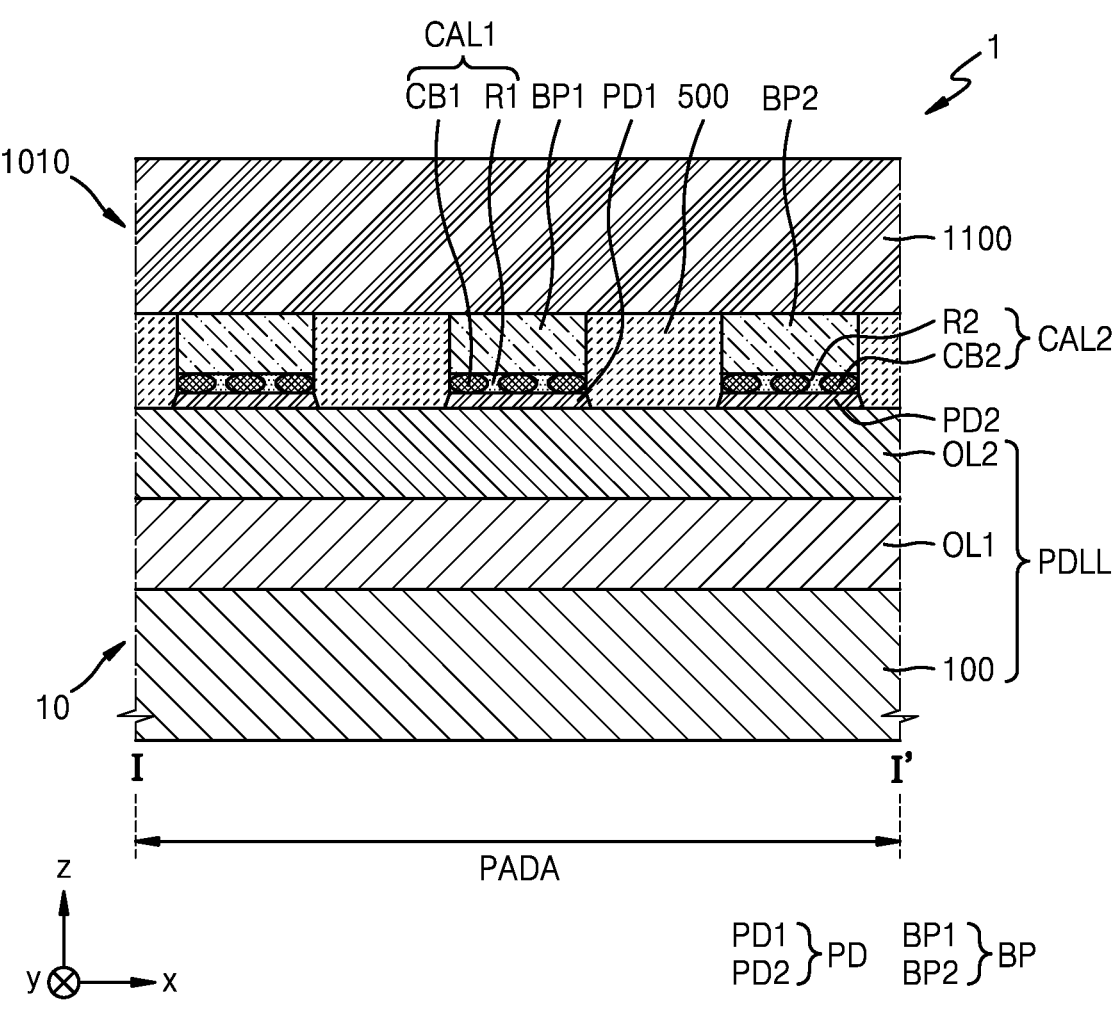
FIG. 10 is a schematic cross-sectional view of the display apparatus of FIG. 3 taken along line I-I' of FIG. 3.

FIG. 10 is a schematic cross-sectional view of the display apparatus 1 of FIG. 3 taken along line I-I' of FIG. 3. As shown in FIG. 10, the display panel 10 may include the plurality of pads PD. In detail, the pad area PADA of the display panel 10 may include the plurality of pads PD. The plurality of pads PD may include a first pad PD1 and a second pad PD2.

The first pad PD1 may be disposed on a pad lower layer PDLL. In the present specification, the term "pad lower layer" may refer to layers disposed under the pads PD among layers included in the display panel 10. In detail, the first pad PD1 is disposed on the substrate 100, and before the first pad PD1 is formed, the first organic insulating layer OL1 and the second organic insulating layer OL2 may be disposed on the substrate 100. In this case, the pad lower layer PDLL may include the substrate 100, the first organic insulating layer OL1, and the second organic insulating layer OL2. FIG. 10 illustrates that the pad lower layer PDLL is the substrate 100, the first organic insulating layer OL1, and the second organic insulating layer OL2, but the disclosure is not limited thereto. For example, when the first pad PD1 is disposed on the substrate 100 on which the inorganic insulating layer IIL and the second organic insulating layer OL2 are disposed, the pad lower layer PDLL may include the substrate 100, the inorganic insulating layer IIL, and the second organic insulating layer OL2. When no layer is arranged between the substrate 100 and the pads PD, the "pad lower layer" may include just the substrate 100.

The first pad PD1 may include the same material as the first contact electrode CM1. In detail, the first pad PD1 may include a conductive material including Mo, Al, Cu, or Ti, and may have a multilayer or single-layered structure including the conductive material. For example, the first pad PD1 may have a multilayer structure of Ti/Al/Ti.

The second pad PD2 may be arranged apart from the first pad PD1 in the first direction (for example, the x direction or the −x direction). Also, the second pad PD2 may be disposed on the same layer as the first pad PD1. In other words, the second pad PD2 may be disposed on the second organic insulating layer OL2. The second pad PD2 may be simultaneously formed of the same material as the first pad PD1. Accordingly, the second pad PD2 may include the same material as the first pad PD1.

A plurality of bumps BP under the body 1100 of the electronic chip package 1010 may be disposed on the plurality of pads PD. The plurality of bumps BP may include a first bump BP1 and a second bump BP2. In detail, the first bump BP1 may be disposed on the first pad PD1 to overlap the first pad PD1, and the second bump BP2 may be disposed on the second pad PD2 to overlap the second pad PD2 in a plan view.

A first conductive adhesive layer CAL1 may be arranged between the first pad PD1 and the first bump BP1. The first pad PD1 and the first bump BP1 may be electrically connected to each other by the first conductive adhesive layer CAL1. The first conductive adhesive layer CAL1 may be a conductive film in which current flows in a thickness direction (i.e., z direction) and is insulated in a width direction or a length direction (e.g., x direction or y direction).

In detail, the first conductive adhesive layer CAL1 may include a first conductive ball CB1 and a first resin R1. The first conductive ball CB1 may be a conductive particle which forms an electrical path between the first pad PD1 and the first bump BP1. The first conductive ball CB1 may be a conductive particle of a tin alloy, which is formed by alloying tin with at least one of Ag, Cu, bismuth, zinc, and indium. Alternatively, the first conductive ball CB1 may be a conductive particle of an indium alloy, which is formed by alloying indium with at least one of Ag, Cu, bismuth, zinc, and tin.

The first resin R1 may be an insulating resin which improves connection reliability by fixing the first conductive ball CB1 at a specific position. In detail, the first conductive ball CB1 may be dispersed in the first resin R1. The first resin R1 may include a thermosetting resin. The first resin R1 may include at least one of a vinyl acetate resin, a styrene resin, an ethylene-vinyl acetate copolymer resin, a styrene-butadiene copolymer resin, and a polyester resin.

A second conductive adhesive layer CAL2 may be arranged apart from the first conductive adhesive layer CAL1 in the first direction (for example, the x direction or the −x direction). The second conductive adhesive layer CAL2 may be arranged between the second pad PD2 and the second bump BP2. The second pad PD2 and the second bump BP2 may be electrically connected to each other by the second conductive adhesive layer CAL2. The second conductive adhesive layer CAL2 may be a conductive film in which current flows in a thickness direction (i.e., z direction) and is insulated in a width direction or a length direction (e.g., x direction or y direction).

In detail, the second conductive adhesive layer CAL2 may include a second conductive ball CB2 and a second resin R2. The second conductive ball CB2 may be a conductive particle which forms an electrical path between the second pad PD2 and the second bump BP2. The second conductive ball CB2 may include the same material as the first conductive ball CB1. In detail, the second conductive ball CB2 may be a conductive particle of a tin alloy, which is formed by alloying tin with at least one of Ag, Cu, bismuth, zinc, and indium. Alternatively, the second conductive ball CB2 may be a conductive particle of an indium alloy, which is formed by alloying indium with at least one of Ag, Cu, bismuth, zinc, and tin.

The second resin R2 may be an insulating resin which improves connection reliability by fixing the second conductive ball CB2 at a specific position. In detail, the second conductive ball CB2 may be disposed in the second resin R2. The second resin R2 may include the same material as the first resin R1. In other words, the second resin R2 may include a thermosetting resin. The second resin R2 may include at least one of a vinyl acetate resin, a styrene resin, an ethylene-vinyl acetate copolymer resin, a styrene-butadiene copolymer resin, and a polyester resin.

An elastic layer 500 may be arranged between a set including the first bump BP1 and the first pad PD1, which are bonded by the first conductive adhesive layer CAL1, and a set including the second bump BP2 and the second pad PD2, which are bonded by the second conductive adhesive layer CAL2. In detail, a portion of the elastic layer 500 may be arranged between the first bump BP1 and the second bump BP2. In other words, the elastic layer 500 may be arranged between the first bump BP1 and the second bump BP2. The elastic layer 500 may be in contact with the body 1100. A portion of the body 1100, which is in contact with the elastic layer 500, may be arranged between the first bump BP1 and the second bump BP2 when viewed in a direction perpendicular to the substrate 100 (i.e., in a plan view). In other words, the elastic layer 500 may be in contact with a portion of the body 1100, the portion being arranged between the first bump BP1 and the second bump BP2 when viewed in the direction perpendicular to the substrate 100.

The direction perpendicular to the substrate 100 may be a direction perpendicular to a major surface of the substrate 100, for example, a z-axis direction.

Another portion of the elastic layer 500 may be arranged between the first conductive adhesive layer CAL1 and the second conductive adhesive layer CAL2. In other words, the second conductive adhesive layer CAL2 may be arranged apart from the first conductive adhesive layer CAL1 with the elastic layer 500 therebetween. Still another portion of the elastic layer 500 may be arranged between the first pad PD1 and the second pad PD2. The elastic layer 500 may be in contact with the pad lower layer PDLL. A portion of the pad lower layer PDLL, which is in contact with the elastic layer 500, may be arranged between the first pad PD1 and the second pad PD2 when viewed in the direction perpendicular to the substrate 100 (i.e., in a plan view). In other words, the elastic layer 500 may be in contact with a portion of the pad lower layer PDLL, the portion being arranged between the first pad PD1 and the second pad PD2 when viewed in the direction perpendicular to the substrate 100.

When the elastic layer 500 is not arranged between the set including the first bump BP1 and the first pad PD1, which are bonded by the first conductive adhesive layer CAL1, and the set including the second bump BP2 and the second pad PD2, which are bonded by the second conductive adhesive layer CAL2, adhesion between the display panel 10 and the electronic chip package 1010 may decrease. In this case, a contact area between the display panel 10 and the electronic chip package 1010 may decrease. In detail, a portion of the body 1100, which is arranged between the first bump BP1 and the second bump BP2 when viewed in the direction perpendicular to the substrate 100, and a portion of the pad lower layer PDLL, which is arranged between the first pad PD1 and the second pad PD2 when viewed in the direction perpendicular to the substrate 100 (i.e., in a plan view), may be arranged apart from each other without adhesion therebetween. Accordingly, adhesion between the display panel 10 and the electronic chip package 1010 may decrease.

When the elastic layer 500 is not arranged between the set including the first bump BP1 and the first pad PD1, which are bonded by the first conductive adhesive layer CAL1, and the set including the second bump BP2 and the second pad PD2, which are bonded by the second conductive adhesive layer CAL2, an empty space may exist between the set including the first bump BP1 and the first pad PD1, which are bonded by the first conductive adhesive layer CAL1, and the set including the second bump BP2 and the second pad PD2, which are bonded by the second conductive adhesive layer CAL2. The empty space is a passage through which moisture may penetrate into the display panel 10 and/or the electronic chip package 1010, and thus, the reliability of the display apparatus 1 may decrease.

However, in the case of the display apparatus 1 according to the present embodiment, such empty space may not exist between the set including the first bump BP1 and the first pad PD1, which are bonded by the first conductive adhesive layer CAL1, and the set including the second bump BP2 and the second pad PD2, which are bonded by the second conductive adhesive layer CAL2. In other words, the elastic layer 500 may be arranged between the set including the first bump BP1 and the first pad PD1, which are bonded by the first conductive adhesive layer CAL1, and the set including the second bump BP2 and the second pad PD2, which are bonded by the second conductive adhesive layer CAL2. A portion of the elastic layer 500 (i.e., lower part of the elastic layer 500) may be in contact with the display panel 10, and another portion of the elastic layer 500 (i.e., upper part of the elastic layer 500) may be in contact with the electronic chip package 1010. Accordingly, adhesion between the display panel 10 and the electronic chip package 1010 may be increased by the elastic layer 500. A space between the set including the first bump BP1 and the first pad PD1, which are bonded by the first conductive adhesive layer CAL1, and the set including the second bump BP2 and the second pad PD2, which are bonded by the second conductive adhesive layer CAL2, is filled with the elastic layer 500, and thus, a passage through which moisture may penetrate into the display panel 10 or the electronic chip package 1010 may not exist. Accordingly, the reliability of the display apparatus 1 may be effectively improved.

The elastic layer 500 may include an elastomer. The elastomer may be included as long as the elastomer is a polymer having elasticity, and is not particularly limited. For example, the elastomer may include at least one of rubber, a urethane-based compound, and a silicon-based compound. Accordingly, the elastic layer 500 may have elasticity and/or be stretchable.

The electronic chip package 1010 may be generally attached to the display panel by using a pressure device. In detail, an anisotropic conductive film may be arranged between the pads PD of the display panel 10 and the bumps BP of the electronic chip package 1010, and the bumps BP may be attached to the pads PD by applying a certain heat and pressure to an upper portion of the electronic chip package 1010 by using a pressure device such as a hot bar. The anisotropic conductive film includes a thermosetting resin and a conductive ball, and the thermosetting resin may be thermally cured when a certain heat and pressure is applied to the upper portion of the electronic chip package 1010. Accordingly, a position of the conductive ball in the thermosetting resin may be fixed.

When an integral anisotropic conductive film is arranged between a plurality of pads PD and a plurality of bumps BP, the anisotropic conductive film may not only be disposed on the pads PD, but also fill a space between the pads PD. In detail, the anisotropic conductive film may be in contact with a portion of the pad lower layer PDLL, the portion being arranged between the first pad PD1 and the second pad PD2 when viewed in the direction perpendicular to the substrate 100 (i.e., in a plan view). Also, the anisotropic conductive film may be in contact with a portion of the body 1100, the portion being arranged between the first bump BP1 and the second bump BP2 when viewed in the direction perpendicular to the substrate 100.

The thermosetting resin included in the anisotropic conductive film may be thermally cured in a process of manufacturing a display apparatus, for example, in a process of attaching the electronic chip package 1010 to the display panel 10 by using the hot bar, and thus, may be rigid. Accordingly, the anisotropic conductive film may not be transformed even when an external force is applied. Accordingly, a portion of the pad lower layer PDLL, which is in contact with the anisotropic conductive film, and a portion of the body 1100, which is in contact with the anisotropic conductive film, may not be easily transformed. In other words, the display panel 10 and the electronic chip package 1010 may not be easily increased or decreased by an external force.

However, in the case of the display apparatus 1 according to the present embodiment, the elastic layer 500 may fill a space between the first conductive adhesive layer CAL1 and the second conductive adhesive layer CAL2. In other words, the first conductive adhesive layer CAL1 and the second conductive adhesive layer CAL2 may be apart from each other with the elastic layer 500 therebetween. In detail, the elastic layer 500 may be in contact with a portion of the pad lower layer PDLL, the portion being arranged between the first pad PD1 and the second pad PD2 when viewed in the direction perpendicular to the substrate 100 (i.e., in a plan view). Also, the elastic layer 500 may be in contact with a portion of the body 1100 (i.e., lower portion of the body 1100), the portion being arranged between the first bump BP1 and the second bump BP2 when viewed in the direction perpendicular to the substrate 100.

As described above, the elastic layer 500 may have elasticity and/or be stretchable, and thus, may increase or decrease when an external force is applied. Accordingly, a portion (i.e., upper portion) of the pad lower layer PDLL, which is in contact with the elastic layer 500, and a portion (i.e., lower portion) of the body 1100, which is in contact with the elastic layer 500, may be easily transformed. In other words, the display panel 10 and the electronic chip package 1010 may be easily increased or decreased by an external force. Accordingly, the stretchability of the display apparatus 1 may be effectively improved.

Figure 11A:
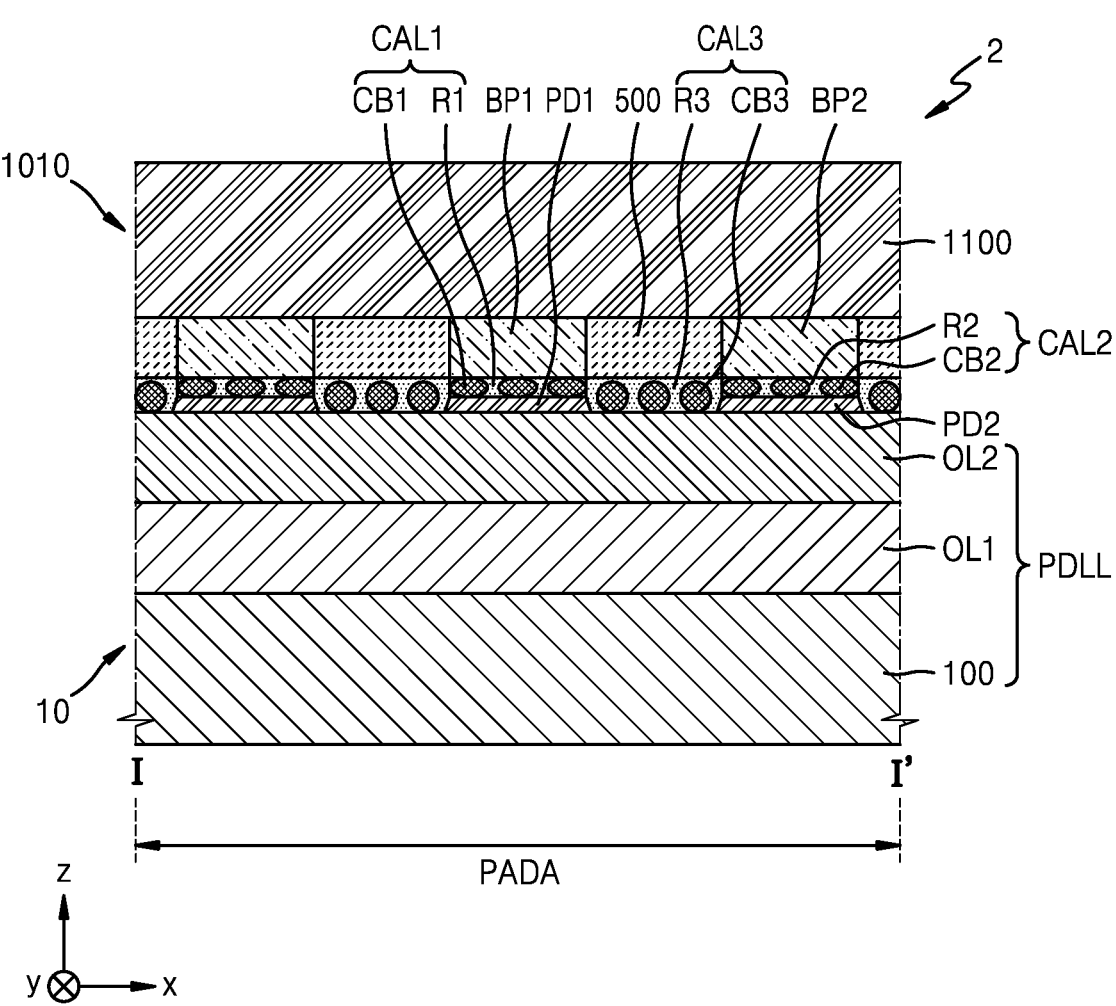
FIGS. 11A and 11B are schematic cross-sectional views of a portion of a display apparatus according to another embodiment.
Figure 11B:
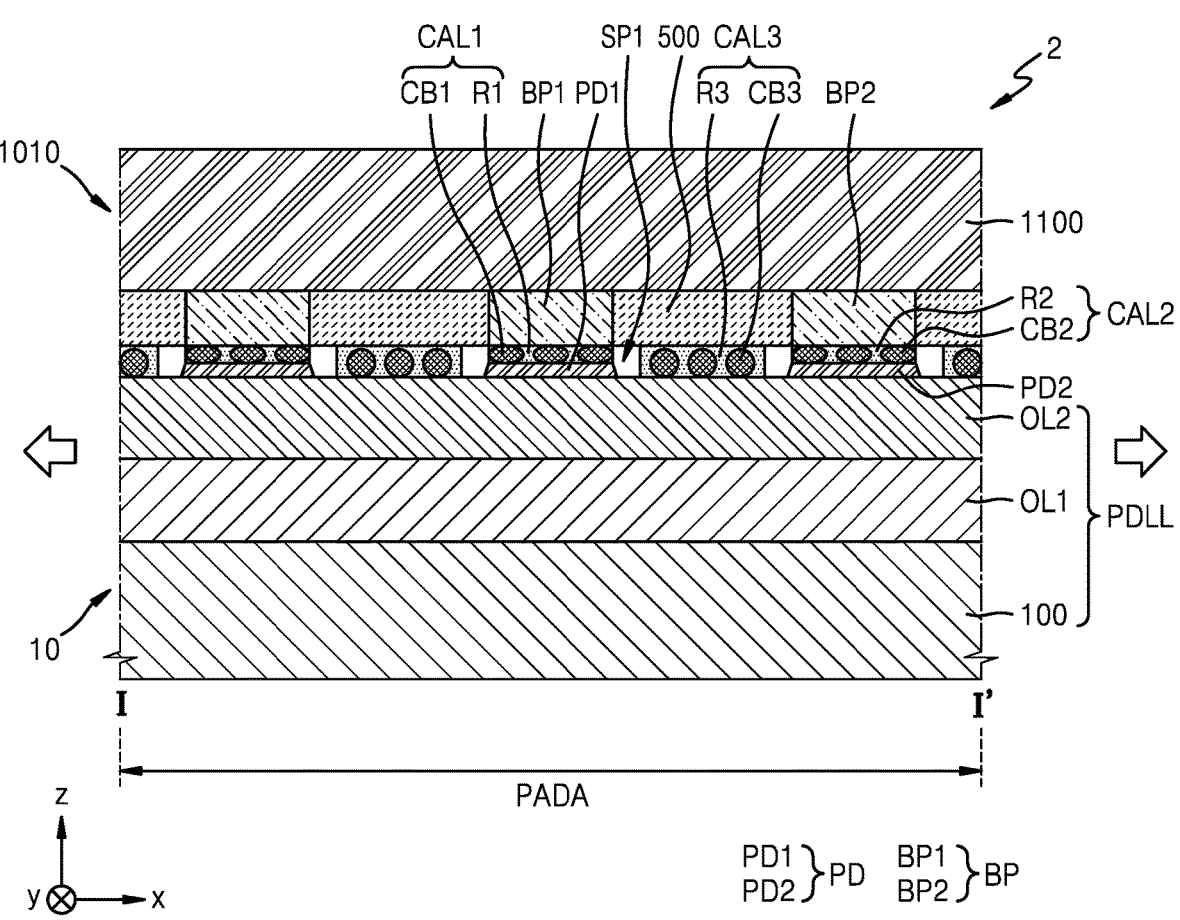

FIGS. 11A and 11B are schematic cross-sectional views of a portion of a display apparatus 2 according to another embodiment. In detail, FIG. 11A is a schematic cross-sectional view of a portion of the display apparatus 2 when an external force is not applied to the display apparatus 2, and FIG. 11B is a schematic cross-sectional view of a portion of the display apparatus 2 when an external force is applied in the first direction (for example, the x direction or the −x direction).

As shown in FIG. 11A, the elastic layer 500 may be arranged between the first bump BP1 and the second bump BP2, and may not be arranged between the first conductive adhesive layer CAL1 and the second conductive adhesive layer CAL2 and between the first pad PD1 and the second pad PD2. A third conductive adhesive layer CAL3 may be disposed under the elastic layer 500. In other words, a portion of the third conductive adhesive layer CAL3 may be disposed between the first conductive adhesive layer CAL1 and the second conductive adhesive layer CAL2. Another portion of the third conductive adhesive layer CAL3 may be arranged between the first pad PD1 and the second pad PD2.

In detail, the third conductive adhesive layer CAL3 may be in contact with the first conductive adhesive layer CAL1 and the second conductive adhesive layer CAL2. The third conductive adhesive layer CAL3 may be in contact with the pad lower layer PDLL. A portion of the pad lower layer PDLL, which is in contact with the third conductive adhesive layer CAL3, may be arranged between the first pad PD1 and the second pad PD2 when viewed in the direction perpendicular to the substrate 100 (i.e., in a plan view). In other words, the third conductive adhesive layer CAL3 may be in contact with a portion of the pad lower layer PDLL, the portion being arranged between the first pad PD1 and the second pad PD2 when viewed in the direction perpendicular to the substrate 100. However, even in this case, the elastic layer 500 may be in contact with a portion of the body 1100, the portion being arranged between the first bump BP1 and the second bump BP2 when viewed in the direction perpendicular to the substrate 100 (i.e., in a thickness direction).

For convenience of explanation, FIG. 11A illustrates that the third conductive adhesive layer CAL3 is a single layer which is in contact with the first conductive adhesive layer CAL1 and the second conductive adhesive layer CAL2, but the disclosure is not limited thereto. For example, the third conductive adhesive layer CAL3 may include a first portion which is in contact with the first conductive adhesive layer CAL1, and a second portion which is apart from the first portion and is in contact with the second conductive adhesive layer CAL2. Alternatively, the third conductive adhesive layer CAL3 may further include a third portion arranged between the first portion and the second portion.

The third conductive adhesive layer CAL3 may include a third conductive ball CB3 and a third resin R3. The third conductive ball CB3 may include the same material as the first conductive ball CB1. In detail, the third conductive ball CB3 may be a conductive particle of a tin alloy, which is formed by alloying tin with at least one of Ag, Cu, bismuth, zinc, and indium. Alternatively, the third conductive ball CB3 may be a conductive particle of an indium alloy, which is formed by alloying indium with at least one of Ag, Cu, bismuth, zinc, and tin.

The third resin R3 may be an insulating resin which fixes the third conductive ball CB3 at a specific position. In detail, the third conductive ball CB3 may be dispersed in the third resin R3. The third resin R3 may include the same material as the first resin R1. In other words, the third resin R3 may include a thermosetting resin. The third resin R3 may include at least one of a vinyl acetate resin, a styrene resin, an ethylene-vinyl acetate copolymer resin, a styrene-butadiene copolymer resin, and a polyester resin.

Even in this case, an empty space may not exist the set including between the first bump BP1 and the first pad PD1, which are bonded by the first conductive adhesive layer CAL1, and the set including the second bump BP2 and the second pad PD2, which are bonded by the second conductive adhesive layer CAL2. In other words, the elastic layer 500 and the third conductive adhesive layer CAL3 may be arranged between the set including the first bump BP1 and the first pad PD1, which are bonded by the first conductive adhesive layer CAL1, and the set including the second bump BP2 and the second pad PD2, which are bonded by the second conductive adhesive layer CAL2. Because the display panel 10 is in contact with the third conductive adhesive layer CAL3, the third conductive adhesive layer CAL3 is in contact with the elastic layer 500, and the elastic layer 500 is in contact with the electronic chip package 1010, adhesion between the display panel 10 and the electronic chip package 1010 may be increased by the third conductive adhesive layer CAL3 and the elastic layer 500. A space between the set including the first bump BP1 and the first pad PD1, which are bonded by the first conductive adhesive layer CAL1, and the set including the second bump BP2 and the second pad PD2, which are bonded by the second conductive adhesive layer CAL2, is filled with the third conductive adhesive layer CAL3 and the elastic layer 500, and thus, a passage through which moisture may penetrate into the display panel 10 or the electronic chip package 1010 may not exist. Accordingly, the reliability of the display apparatus 2 may be effectively improved.

When an external force is applied to the display apparatus 2 in the first direction (for example, the x direction or the −x direction), as shown in FIG. 11B, the third conductive adhesive layer CAL3 may be arranged apart from the first conductive adhesive layer CAL1 and the second conductive adhesive layer CAL2. In other words, a first space SP1 surrounded by the elastic layer 500, the first conductive adhesive layer CAL1, the pad lower layer PDLL, and the third conductive adhesive layer CAL3 may be formed. The first space SP1 may be shown in a cross-sectional view taken along a plane crossing the pads PD and the bumps BP and perpendicular to the substrate 100. Another space surrounded by the elastic layer 500, the second conductive adhesive layer CAL2, the pad lower layer PDLL, the third conductive adhesive layer CAL3 may also be formed.

As described above, the pad area PADA and the body 1100 may be stretchable, and the pad lower layer PDLL included in the pad area PADA may also be stretchable. Accordingly, when an external force is applied to the display apparatus 2 in the first direction (for example, the x direction or the −x direction), a portion of the pad lower layer PDLL may increase, the portion being arranged between the first pad PD1 and the second pad PD2 when viewed in the direction perpendicular to the substrate 100 (i.e., in a plan view). A portion of the body 1100 may also increase, the portion being arranged between the first bump BP1 and the second bump BP2 when viewed in the direction perpendicular to the substrate 100. In this case, because the third conductive adhesive layer CAL3 includes a thermosetting resin, the third conductive adhesive layer CAL3 may not be increased by an external force. However, a distance between the third conductive adhesive layer CAL3 and the first conductive adhesive layer CAL1 and/or a distance between the third conductive adhesive layer CAL3 and the second conductive adhesive layer CAL2 may increase. Accordingly, the stretchability of the display apparatus 2 may be improved.

When the external force that has been applied to the display apparatus 2 in the first direction (for example, the x direction or the −x direction) is removed, the portion of the pad lower layer PDLL, which has increased in response to the external force being applied to the display apparatus 2 in the first direction (for example, the x direction or the −x direction), may decrease. Also, the portion of the body 1100, which has increased in response to the external force being applied to the display apparatus 2 in the first direction (for example, the x direction or the −x direction), may also decrease. Accordingly, like the case where the external force is not applied to the display apparatus 2 shown in FIG. 11A, when the external force that has been applied to the display apparatus 2 is removed, the third conductive adhesive layer CAL3 may be in contact with the first conductive adhesive layer CAL1 and the second conductive adhesive layer CAL2.

Hereinbefore, the display apparatus has been described, but the disclosure is not limited thereto. The disclosure also includes a method of manufacturing the display apparatus. Hereinafter, the method of manufacturing the display apparatus is described.

FIGS. 12A to 12D are diagrams for explaining a method of manufacturing the display apparatus 1, according to an embodiment. In detail, FIGS. 12A to 12D are schematic cross-sectional views of a process of bonding the display panel 10 and the electronic chip package 1010 together.

Figure 12A:
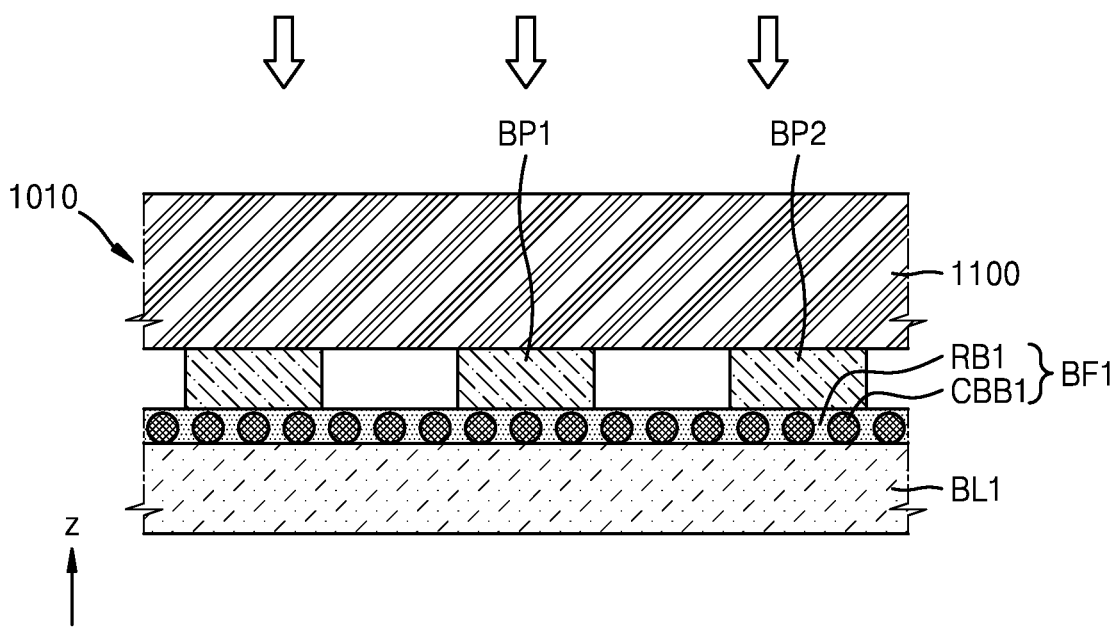
FIGS. 12A to 12D are diagrams for explaining a method of manufacturing a display apparatus, according to an embodiment.

First, as shown in FIG. 12A, the first bump BP1 and the second bump BP2 included in the electronic chip package 1010 may be disposed on a first base film BF1. The first base film BF1 may include a first base resin RB1 and a first base conductive ball CBB1. In other words, the first base film BF1 may be an anisotropic conductive film including polymer resin and a conductive ball.

In detail, the electronic chip package 1010 may be disposed on the first base film BF1 such that a lower surface (in a −z direction) of the first bump BP1 included in the electronic chip package 1010 and a lower surface (in the −z direction) of the second bump BP2 face an upper surface (in a +z direction) of the first base film BF1. The first base film BF1 may be disposed on a first base layer BL1 (i.e., contact the first base layer BL1). Afterwards, the electronic chip package 1010 is pressed to transfer a portion of the first base film BF1 to the lower surface (in the −z direction) of the first bump BP1, such that the first conductive adhesive layer CAL1 may be attached under the first bump BP1. Another portion of the first base film BF1 may be transferred to the lower surface (in the −z direction) of the second bump BP2, and accordingly, the second conductive adhesive layer CAL2 may be attached under of the second bump BP2.

Figure 12B:
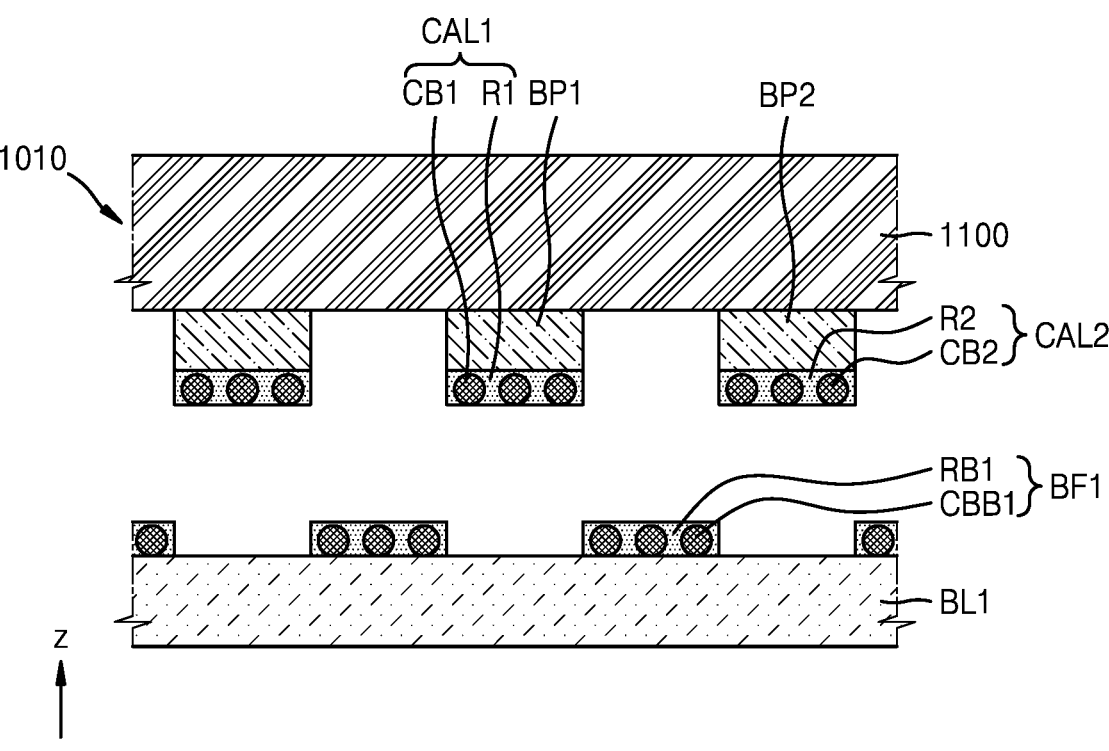

In this case, as shown in FIG. 12B, only the portions of the first base film BF1, which are disposed under the first bump BP1 and the second bump BP2, may be separated from the first base layer BL1. In other words, the first conductive adhesive layer CAL1 may be the portion of the first base film BF1, which is disposed under the first bump BP1, and the second conductive adhesive layer CAL2 may be the portion of the first base film BF1, which is disposed under the second bump BP2.

Figure 12C:
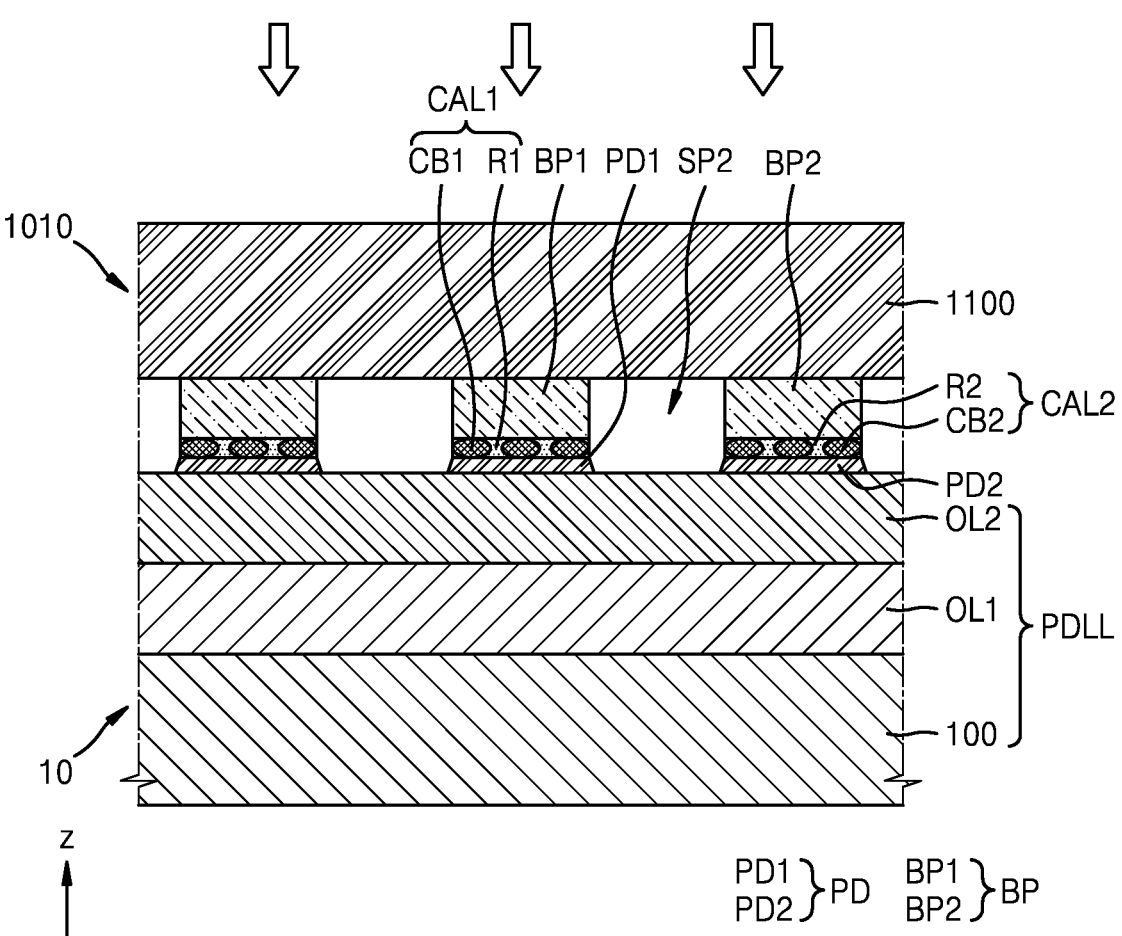

Next, as shown in FIG. 12C, the first bump BP1 may be disposed on the first pad PD1, and the second bump BP2 may be disposed on the second pad PD2. Afterwards, the first bump BP1 may be attached to the first pad PD1, and the second bump BP2 may be attached to the second pad PD2, by applying a certain heat and pressure to the upper portion of the electronic chip package 1010 by using a pressure device such as a hot bar. In detail, the first conductive adhesive layer CAL1 attached to the first bump BP1 may be attached to the first pad PD1, and the second conductive adhesive layer CAL2 attached to the second bump BP2 may be attached to the second pad PD2. Accordingly, a second space SP2 surrounded by the first pad PD1, the first conductive adhesive layer CAL1, the first bump BP1, the body 1100, the second bump BP2, the second conductive adhesive layer CAL2, the second pad PD2, and the pad lower layer PDLL may be defined in a cross-sectional view taken along a plane crossing the pads PD and the bumps BP and perpendicular to the substrate 100.

Figure 12D:
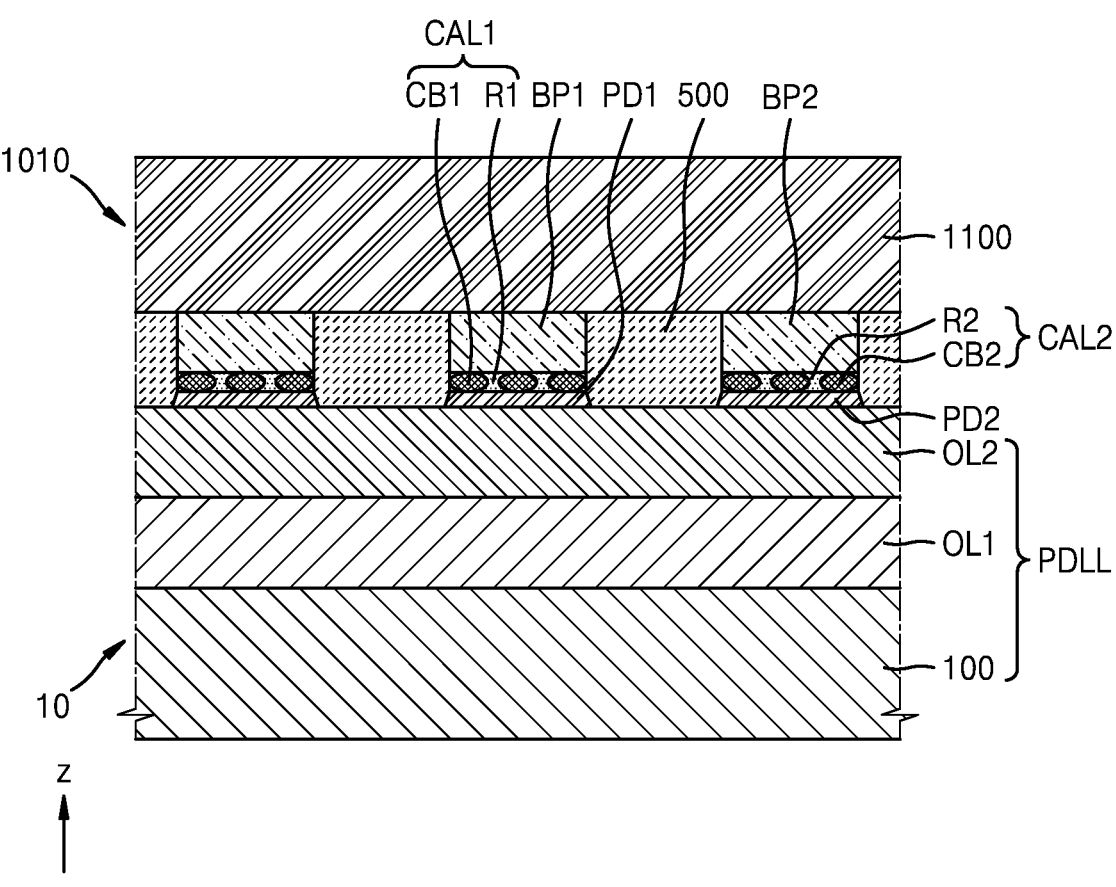

Next, as shown in FIG. 12D, the second space SP2 may be filled with an elastic layer composition. The elastic layer composition may include an elastomer. For example, the elastic layer composition may include at least one of rubber, a urethane-based compound, and a silicon-based compound. Also, the elastic layer composition may further include a solvent. The solvent included in the elastic layer composition may include any solvent which may dissolve at least one of rubber, a urethane-based compound, and a silicon-based compound, and is not particularly limited. In other words, the elastic layer composition may be a solution obtained by dissolving at least one of rubber, a urethane-based compound, and a silicon-based compound in the solvent.

The elastic layer composition may be filled in the second space SP2 by capillary force. Hereinafter, the second space SP2 may be filled with the elastic layer 500 by heating the elastic layer composition filled in the second space SP2 to remove the solvent. In other words, a portion of the elastic layer 500 may be arranged between the first bump BP1 and the second bump BP2, another portion of the elastic layer 500 may be arranged between the first conductive adhesive layer CAL1 and the second conductive adhesive layer CAL2, and still another portion of the elastic layer 500 may be arranged between the first pad PD1 and the second pad PD2. The elastic layer 500 may become in contact with a portion of the body 1100 (i.e., lower portion of the body 1100), the portion being arranged between the first bump BP1 and the second bump BP2 when viewed in the direction perpendicular to the substrate 100, and may become in contact with a portion of the pad lower layer PDLL (i.e., upper portion of the pad lower layer PDLL), the portion being arranged between the first pad PD1 and the second pad PD2 when viewed in the direction perpendicular to the substrate 100 (i.e., in a plan view).

Figure 13A:
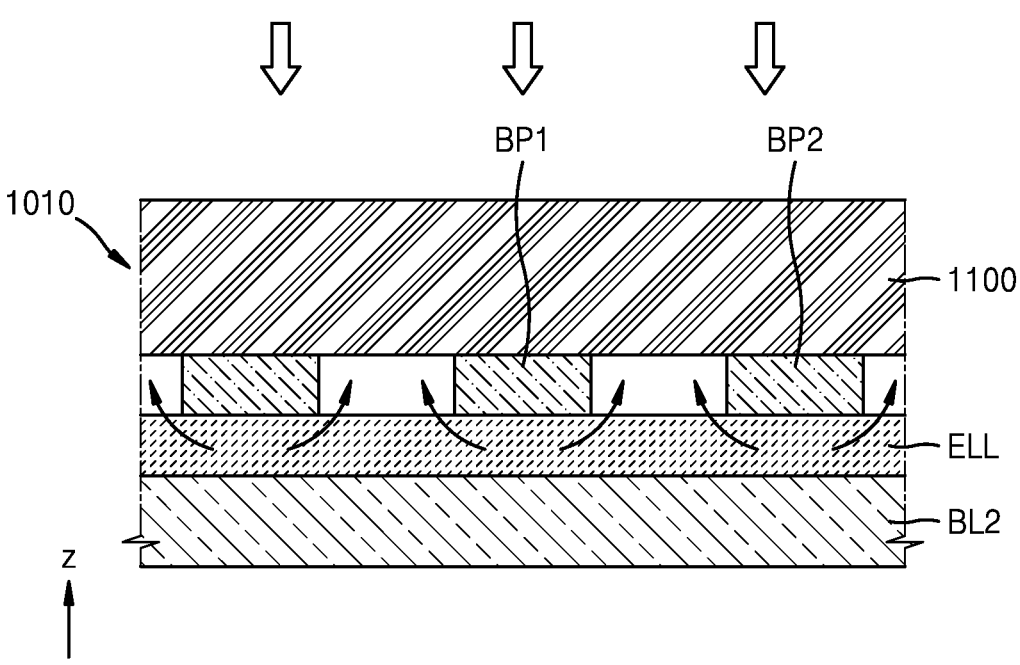
FIGS. 13A and 13B are diagrams for explaining a method of manufacturing a display apparatus, according to another embodiment.
Figure 13B:
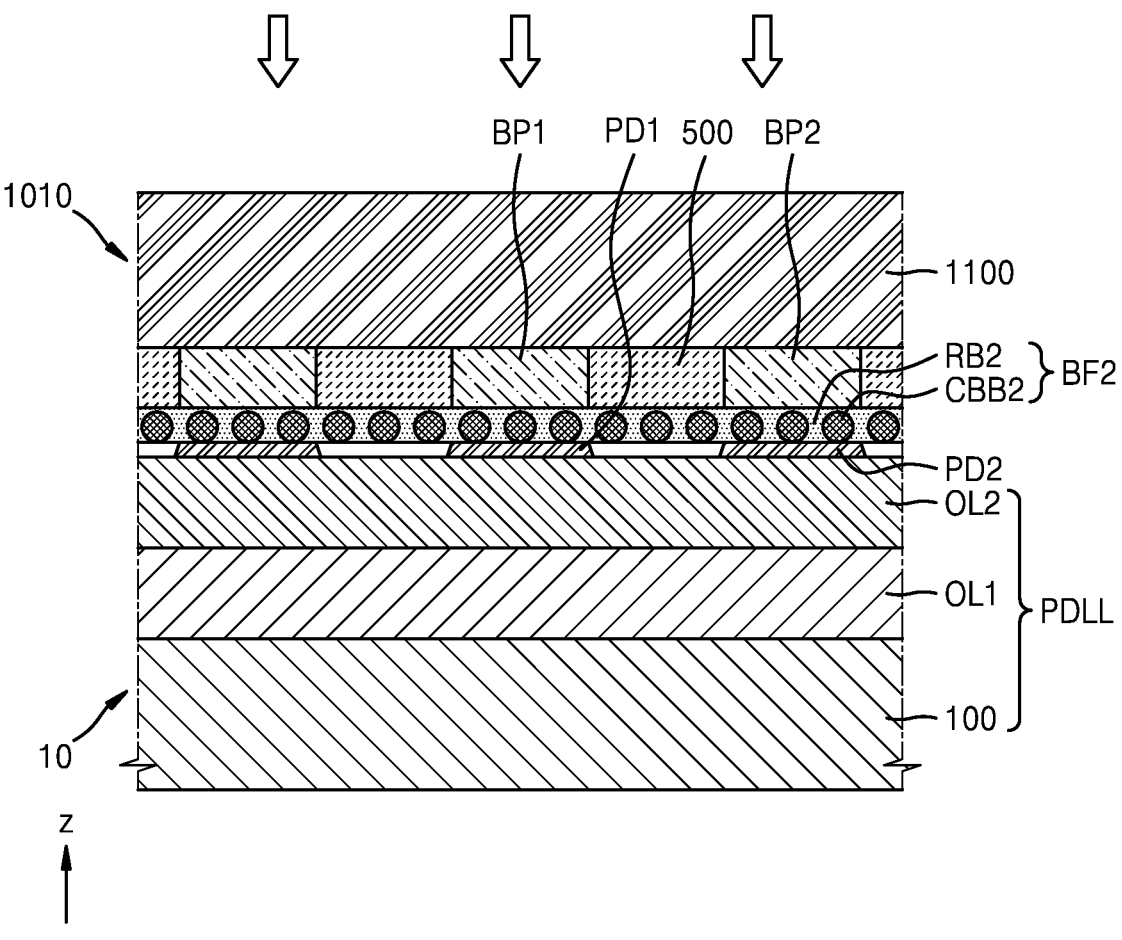

FIGS. 13A and 13B are diagrams for explaining a method of manufacturing the display apparatus 2, according to another embodiment. In detail, FIGS. 13A and 13B are schematic cross-sectional views of a process of bonding the display panel 10 and the electronic chip package 1010 together.

First, as shown in FIG. 13A, the first bump BP1 and the second bump BP2 included in the electronic chip package 1010 may be disposed on an elastomer layer ELL. The elastomer layer ELL may include an elastomer. The elastomer may be included as long as the elastomer is a polymer having elasticity, and is not particularly limited. In an embodiment, for example, the elastomer may include at least one of rubber, a urethane-based compound, and a silicon-based compound.

In detail, the electronic chip package 1010 may be disposed on the elastomer layer ELL such that the lower surface (in the −z direction) of the first bump BP1 and the lower surface (in the −z direction) of the second bump BP2 included in the electronic chip package 1010 face an upper surface (in the +z direction) of the elastomer layer ELL. The elastomer layer ELL may be disposed on a second base layer BL2. Afterwards, the elastomer may be arranged between the first bump BP1 and the second bump BP2 by pressing the electronic chip package 1010. In detail, when the electronic chip package 1010 is pressed, portions of the elastomer layer ELL, which are disposed under the first bump BP1 and the second bump BP2, may move to spaces between the first bump BP1 and the second bump BP2. The elastic layer 500 shown in FIG. 13B may be formed by the elastomer moving to the space between the first bump BP1 and the second bump BP2. The viscosity and hardness of the elastomer layer ELL may be appropriately selected so that portions of the elastomer layer ELL, to which an external force is applied, may move.

Next, as shown in FIG. 13B, a second base film BF2 may be disposed on the first pad PD1 and the second pad PD2. The second base film BF2 may include a second base resin RB2 and a second base conductive ball CBB2. In other words, the second base film BF2 may be an anisotropic conductive film including polymer resin and a conductive ball.

A portion of the second base film BF2 may be arranged between the first pad PD1 and the second pad PD2 when viewed in the direction perpendicular to the substrate 100 (i.e., in a plan view). Afterwards, the first bump BP1 may be disposed on the first pad PD1, and the second bump BP2 may be disposed on the second pad PD2. The elastic layer 500 may be disposed on a portion of the second base film BF2, the portion being arranged between the first pad PD1 and the second pad PD2 when viewed in the direction perpendicular to the substrate 100. The first bump BP1 may be attached to the first pad PD1, and the second bump BP2 may be attached to the second pad PD2, by applying a certain heat and pressure to the upper portion of the electronic chip package 1010 by using a pressure device such as a hot bar.

Accordingly, the first conductive adhesive layer CAL1, the second conductive adhesive layer CAL2, and the third conductive adhesive layer CAL3 as shown in FIG. 11A may be formed. In detail, the first conductive adhesive layer CAL1 may be a portion of the second base film BF2, which is arranged between the first pad PD1 and the first bump BP1. The second conductive adhesive layer CAL2 may be a portion of the second base film BF2, which is arranged between the second pad PD2 and the second bump BP2. The third conductive adhesive layer CAL3 may be a portion of the second base film BF2, the portion being arranged between the first pad PD1 and the second pad PD2 when viewed in the direction perpendicular to the substrate 100 (i.e., in a plan view).

However, due to the certain heat and pressure applied to the upper portion of the electronic chip package 1010, the portion of the second base film BF2, which is arranged between the first pad PD1 and the second pad PD2, moves in the −z direction. Accordingly, as shown in FIG. 11A, the third conductive adhesive layer CAL3 may become in contact with the pad lower layer PDLL. The portion of the second base film BF2, which is arranged between the first pad PD1 and the first bump BP1 or between the second pad PD2 and the second bump BP2, may decrease in thickness (in the z-axis direction) due to the certain heat and pressure applied to the upper portion of the electronic chip package 1010. Accordingly, as shown in FIG. 11A, each of a thickness (in the z-axis direction) of the first conductive adhesive layer CAL1 and a thickness (in the z-axis direction) of the second conductive adhesive layer CAL2 may be less than a thickness (in the z-axis direction) of the third conductive adhesive layer CAL3.

A thickness (in the z-axis direction) of the second base film BF2 may be about 4 micrometers (μm) or less. In the case, as described above, even when the first conductive adhesive layer CAL1, the second conductive adhesive layer CAL2, and the third conductive adhesive layer CAL3 are integrally formed, the third conductive adhesive layer CAL3 may be easily apart from the first conductive adhesive layer CAL1 and the second conductive adhesive layer CAL2 by an external pressure. In other words, even when the first conductive adhesive layer CAL1, the second conductive adhesive layer CAL2, and the third conductive adhesive layer CAL3 are integrally provided, the third conductive adhesive layer CAL3 may be easily separated from the first conductive adhesive layer CAL1 and the second conductive adhesive layer CAL2 by an external pressure. Accordingly, a portion of the display panel 10, which is in contact with the third conductive adhesive layer CAL3, and a portion of the electronic chip package 1010, which is in contact with the elastic layer 500, may be easily transformed. In other words, the display panel 10 and the electronic chip package 1010 may be easily increased or decreased by an external force.

As described above, according to an embodiment, a display apparatus in which adhesion between a display panel and an electronic chip package is excellent and stretchability is improved at the same time may be implemented. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a display panel comprising a first pad and a second pad;
an electronic chip package comprising a first bump arranged to overlap the first pad and a second bump arranged to overlap the second pad;

a first conductive adhesive layer arranged between the first pad and the first bump and comprising a first resin and a first conductive ball;
a second conductive adhesive layer arranged between the second pad and the second bump and comprising a second resin including a same material as the first resin and a second conductive ball including a same material as the first conductive ball; and
an elastic layer arranged between the first bump and the second bump and directly contacting the first bump and the second bump, the elastic layer comprising an elastomer.

2. The display apparatus of claim 1, wherein the second conductive adhesive layer is arranged apart from the first conductive adhesive layer.

3. The display apparatus of claim 1, wherein the elastic layer is further arranged between the first conductive adhesive layer and the second conductive adhesive layer.

4. The display apparatus of claim 1, wherein the elastic layer is further arranged between the first pad and the second pad.

5. The display apparatus of claim 4, wherein the display panel further comprises a pad lower layer disposed under the first pad and the second pad and which comprises a substrate,
the electronic chip package further comprises a body disposed on the first bump and the second bump,
the elastic layer is in contact with a portion of the pad lower layer, the portion being arranged between the first pad and the second pad in a plan view, and
the elastic layer is in contact with a portion of the body, the portion being arranged between the first bump and the second bump in the plan view.

6. The display apparatus of claim 1, further comprising a third conductive adhesive layer disposed under the elastic layer and comprising a third resin including the same material as the first resin and a third conductive ball including the same material as the first conductive ball.

7. The display apparatus of claim 6, wherein the third conductive adhesive layer is arranged between the first conductive adhesive layer and the second conductive adhesive layer.

8. The display apparatus of claim 7, wherein the third conductive adhesive layer is further arranged between the first pad and the second pad.

9. The display apparatus of claim 8, wherein the third conductive adhesive layer is in contact with the first conductive adhesive layer and the second conductive adhesive layer.

10. The display apparatus of claim 8, wherein the display panel further comprises a pad lower layer disposed under the first pad and the second pad and which comprises a substrate,
the electronic chip package further comprises a body disposed on the first bump and the second bump,
the third conductive adhesive layer is in contact with the pad lower layer arranged between the first pad and the second pad in a plan view, and
the elastic layer is in contact with a portion of the body, the portion being arranged between the first bump and the second bump in the plan view.

11. The display apparatus of claim 10, wherein the pad lower layer and the body are stretchable, and
when an external force greater than or equal to a certain magnitude is applied to the pad lower layer and the body, the third conductive adhesive layer is apart from the first conductive adhesive layer and the second conductive adhesive layer.

12. The display apparatus of claim 11, wherein, when the external force greater than or equal to the certain magnitude is applied to the pad lower layer and the body, the elastic layer, the first conductive adhesive layer, the pad lower layer, and the third conductive adhesive layer define an empty space in a cross-sectional view taken along a plane crossing the first pad, the second pad, the first bump, and the second bump and perpendicular to the substrate.

13. The display apparatus of claim 1, wherein the elastic layer comprises at least one of rubber, a urethane-based compound, and a silicon-based compound.

14. A method of manufacturing a display apparatus, the method comprising:

providing a display panel comprising a first pad and a second pad;

providing an electronic chip package including a first bump and a second bump; and bonding the display panel and the electronic chip package together, such that the first pad and the first bump overlap each other, the second pad and the second bump overlap each other, a first conductive adhesive layer comprising a first resin and a first conductive ball is arranged between the first pad and the first bump, a second conductive adhesive layer comprising a second resin including a same material as the first resin and a second conductive ball including a same material as the first conductive ball is arranged between the second pad and the second bump, and an elastic layer comprising an elastomer is arranged between the first bump and the second bump and directly contacts the first bump and the second bump.

15. The method of claim 14, wherein the bonding of the display panel and the electronic chip package together comprises:

arranging, on an anisotropic conductive film, the first bump and the second bump included in the electronic chip package and applying pressure to the electronic chip package;

attaching the first conductive adhesive layer under the first bump by transferring a portion of the anisotropic conductive film to the first bump;

attaching the second conductive adhesive layer under the second bump by transferring another portion of the anisotropic conductive film to the second bump;

arranging the first bump on the first pad and arranging the second bump on the second pad;

attaching the first conductive adhesive layer to the first pad; and attaching the second conductive adhesive layer to the second pad.

16. The method of claim 15, wherein the display panel further comprises a pad lower layer disposed under the first pad and the second pad and which comprises a substrate, the electronic chip package further comprises a body disposed on the first bump and the second bump, and the bonding of the display panel and the electronic chip package together further comprises:

arranging the elastic layer between the first bump and the second bump, by filling a space surrounded by the first pad, the first conductive adhesive layer, the first bump, the body, the second bump, the second conductive adhesive layer, the second pad, and the pad lower layer with an elastic layer composition, and heating the elastic layer composition.

17. The method of claim 14, wherein the elastic layer is further arranged between the first conductive adhesive layer and the second conductive adhesive layer.

18. The method of claim 14, wherein the elastic layer is further arranged between the first pad and the second pad.

19. The method of claim 14, wherein the elastic layer comprises at least one of rubber, a urethane-based compound, and a silicon-based compound.

20. The method of claim 14, wherein the bonding of the display panel and the electronic chip package together comprises:

arranging the elastomer between the first bump and the second bump by arranging, on an elastomer layer comprising the elastomer, the first bump and the second bump included in the electronic chip package and applying pressure to the electronic chip package;

arranging an anisotropic conductive film on the first pad and the second pad;

arranging the first bump on the first pad;

arranging the second bump on the second pad; and applying pressure to and heating the electronic chip package.

* * * * *